United States Patent
Kida

(10) Patent No.: US 8,229,986 B2
(45) Date of Patent: Jul. 24, 2012

(54) SIGNAL APPROXIMATION SYSTEM FOR MINIMIZING THE MEASURE OF WORST-CASE ERROR

(75) Inventor: Takuro Kida, Tokyo (JP)

(73) Assignee: Nihon University, Tokyo (JP)

( * ) Notice: Subject to any disclaimer, the term of this patent is extended or adjusted under 35 U.S.C. 154(b) by 1337 days.

(21) Appl. No.: 11/909,617

(22) PCT Filed: Mar. 29, 2006

(86) PCT No.: PCT/JP2006/306431
§ 371 (c)(1),
(2), (4) Date: Sep. 24, 2007

(87) PCT Pub. No.: WO2006/106713
PCT Pub. Date: Oct. 12, 2006

(65) Prior Publication Data
US 2011/0010407 A1    Jan. 13, 2011

(30) Foreign Application Priority Data
Mar. 30, 2005  (JP) .................................. 2005-096801

(51) Int. Cl.
*G06F 17/10* (2006.01)
(52) U.S. Cl. ........................................ 708/300; 708/290
(58) Field of Classification Search .................. None
See application file for complete search history.

(56) References Cited

U.S. PATENT DOCUMENTS

| | | | | |
|---|---|---|---|---|
| 6,363,175 | B1 * | 3/2002 | Scheirer et al. | 382/232 |
| 6,473,475 | B1 * | 10/2002 | Putzeys | 375/350 |
| 7,263,543 | B2 * | 8/2007 | Beaumont | 708/400 |
| 2003/0107442 | A1 * | 6/2003 | Staszewski | 331/1 A |

* cited by examiner

*Primary Examiner* — Lewis A Bullock, Jr.
*Assistant Examiner* — Michael D Yaary
(74) *Attorney, Agent, or Firm* — patenttm.us

(57) ABSTRACT

The purpose of this invention is that the optimum approximation formula can be derived even if an analysis filter has non-linear characteristic in a discrete signal approximation system. The norm of source signal 1 is bounded. Analysis filters 2 of FIR filters yield the output signal that is expressed with polynomial of transformed source signal 1 through a unit filter. An interpolation function is calculated according to the filter characteristic based upon the multi-dimensional function transformed from the polynomial. The output signal of the analysis filter 2 is sampled after each constant interval to obtain a discrete signal. The approximation function of the power function of the source signal 1 is calculated with linear combination of the interpolation functions using the discrete signals as coefficients. The radical of this approximation function is calculated to derive the root approximation function of the source signal 1. The root approximation functions of all sampling timings are composed to make a total approximation function.

8 Claims, 13 Drawing Sheets

Input f includes Digital Image 1 denoted by Red and Digigal Image 2 denoted by Green.

f=g holds in good Approximation with high-quality Filter Bank. Regarding that similar inputs f and g yield similar outputs, Red and Green should appear in output with good approximation.

SIGNAL APPROXIMATION SYSTEM FOR MINIMIZING THE MEASURE OF WORST-CASE ERROR

FIELD OF THE INVENTION

This invention relates to a signal approximation system, especially to a signal approximation system to minimize any worst-case measure of error, simultaneously, when the discrete sample points of the signal set, the analysis filters and the output signals of the analysis filters are specified.

BACKGROUND ART

Such a time-continuous wave as music or voice is called a continuous signal. Though these signals have the value according to the progress of time, a signal is also called a continuous signal that its value varies continuously according to distance or something else. And such signal processing is called continuous signal processing that is executed continuously to a continuous signal. Such a signal is also a continuous signal that its value is continuous in space like a picture. Such signal processing is also called continuous signal processing that it is executed continuously in space to a continuous signal on the space. Such a signal is a one-dimensional continuous signal that one variance as time or distance decides its continuous value. Such a signal is a multi-dimensional continuous signal that its value is continuous in space like a picture On the other hand, a discrete time sequence like a digital watch or a discrete spatial point sequence like a chessboard is called discrete sample points or sample points simply. The value defined at each discrete sample point is called a sample value. A sequence of sample values is called a discrete signal. Also in this case, when the discrete sample points are placed on one axis, it is called a one-dimensional discrete signal. When the sample values are defined in a multi-dimensional space, it is called a multi-dimensional discrete signal. A sample value may be a sample value of some continuous signal or it may be simply a numerical value defined at a sample point. Especially, an operation to obtain sample values of a continuous signal, is called sampling. Also, operations that obtain a sample value or a part of sample values or all the sample values of a discrete signal at discrete sample points, are called sampling. A discrete sample value may be an irrational number such as $\tau$, for example. Generally, it is not always a finite digit binary number. Therefore, a sample value would be truncated to obtain finite digit binary number for convenience of calculation or data compression. That process is called quantization.

Suppose that there are two signals f and h. A signal y is defined as an output signal of a system S when the signal f is input to the system S. A signal z is defined as an output signal of a system S when the signal h is input to the system S. That is, $y=S(f)$ and $z=S(h)$. When the sum of the signals f and h, that is, $(f+h)$, is input to the system S, suppose that the output signal of the system S becomes always $(y+z)$, that is, the sum of two outputs y and z. Then, the system S is called a linear system. That is to say, if the following equation is valid, the system S is called a linear system.

$$S(f+h)=(y+z)=S(f)+S(h)$$

Let a and b be complex constants. In general, if the following equation is valid, the system S is called a linear system.

$$S(af+bh)=(ay+bz)=aS(f)+bS(h)$$

A system that is not linear is called a non-linear system. An output signal of a non-linear system does not always become double when an input signal is made double. An ordinary communication filter, a lens or a camera can be considered as a linear system. However, a communication filter becomes a non-linear system when its output signal is quantized, for example. Strictly saying, depending upon the characteristics of materials, a lens or a camera may become a non-linear system.

A signal can be divided into a set of sinusoidal waves of different frequencies in many cases. The sequence of the different sinusoidal waves to form the signal is called a frequency spectrum or a frequency characteristic of the signal. Such mathematical conversion is called Fourier transform to derive the frequency spectrum of the signal from the signal itself. The transformation to carry out inverse operation is called inverse Fourier transform. The Fourier transform and inverse Fourier transform are defined to a signal having limited energy. The 2nd power of a norm can be considered as a generalized concept of energy. A set of signals with limited squared norm is known well in the mathematical world as Hilbert space. There are many transformation defined in Hilbert space such as Hankel transform used in the analysis of a lens system, a wavelet transform used for a radar and so on. A signal and its spectrum can be defined also in Hilbert space. In that case, both the formulation to derive a spectrum from a signal and an inverse formulation to compose a signal from its spectrum do not necessarily hold simultaneously. For example, in some case, a spectrum is defined first and then a signal would be defined by the inverse transform of the spectrum.

Observing the various systems in the present industrial field and the present medical field, such equipments that perform the following estimation or processing of signals are included in the systems in many cases.

(1) A preprocessing is performed to obtain unknown external signals through a given linear or non-linear system or through given parallel divided linear or non-linear systems.

(2) The preprocessed signal is sampled at discrete sample points to obtain the sample value of the signal. All or some of the sample values are quantized in postprocessing to create discrete data.

(3) This discrete data is processed in certain way to estimate the unknown external signal.

At this time, the system for continuous signals like a camera, an optical device, an analog filter, computer tomography or NMR equipment may be used as an acquisition system for unknown signals stated in (1). There is also a system like a discrete filter that is used in a digital signal processing or in a time-sharing communication system, in order to preprocess a signal after digitizing the signal.

However, the processing is mainly discrete signal processing in many cases according to recent rapid progress of LSI technology. For this reason, these equipments are almost as above-mentioned signal-processing system. That is, discrete data is obtained by sampling those signals whether the preprocessed signal is a continuous signal or a discrete signal. In many cases, the unknown signal is approximately estimated by discrete signal processing based on those discrete data. Some equipments use all the discrete data and some equipments use discrete data partially. The final estimated signal itself, might be a discrete signal. The final estimated signal may be obtained, by converting the approximate discrete signal that is obtained by the signal-estimation into continuous signal, by interpolation.

Number of discrete data and interval of sample points relate directly to the computational complexity for post-processing. The importance of signal processing has increased in recent years in natural image processing, medical image processing, image processing at SAR radar and image processing a robot's eye. The sample points for processing increase instantly and many expensive high-speed LSIs are required when the sample point interval is shortened to estimate the signal accurately in such systems with multi-dimensional signal processing as mentioned above. For this reason, sample values are thinned out in creating data. The input signals between the remained thinned-out samples are approximately restored with interpolation. Or, the input signals are approximately restored with extrapolation to predict the input signals outside of the sampling region. There arises a problem to minimize the approximation error due to interpolation or extrapolation.

Method to approximate the original signal with linear processing of sample values, is explained. Consider such function or vector function in Hilbert space that the weighted norm of the function is less than given positive number. We call these functions spectrum. Simply saying, the spectrum of lower energy than the specific value is treated. This is practically appropriate. Continuous or discrete signal derived from this spectrum by linear inverse transform, such as sum of product, integral, or linear inverse transform that is generalization of those transformations, is an object signal that is processed in approximation. It is assumed that such a signal is given as an external unknown signal and a series of following processing is performed.

(1) External unknown signals are obtained through the preprocessing system.

(2) The sample values of the preprocessed signals are obtained by sampling at the discrete sample points. The discrete data is created with post-processing by quantizing those sample values and so on.

(3) The external unknown signals are estimated by some signal processing from these discrete data.

In the processing of (3), formula that calculates the total or partial sum of each term that is product of each sample value and a function corresponding to coefficient is used as approximation formula. That function multiplied to each sample value is called interpolation function. Considering many kinds of functions to express the error between the resultant approximation and the source signal, we consider the upper limit of those functions with respect to all the source signals as measure of error. There are many kinds of measures of errors such as measure of error of absolute value, measure of error of square area, and so on.

Profile of linear signal preprocessing with linear system is explained. First, an FIR filter is explained. FIG. 5 shows a circuit called FIR filter. As shown in FIG. 5, the input signal f(t) passes the advancing circuit to advance the signal by unit time τ, or the delay circuit to delay the signal by unit time τ. After that, complex coefficient kn (n=−N, −N+1, . . . , N) is multiplied to the signal. More over, the result is totally summed up with an adder circuit to yield the output f0(t).

Here, the limit of the above-mentioned total sum is determined according to the number of the advancing circuit and the delay circuit. In fact, as the advancing circuit is impossible, the output signal is delayed according to the number of the advancing circuits. Therefore, in fact, the signal enters to the leftmost terminal of the circuit shown in FIG. 5. In this reason, when the signal is processed with FIR filter, some delay is inevitable. This delay is of course according to the number of the advancing circuits. The larger is this number, the larger is the delay. Here, ignoring the above-mentioned delay, consider the FIR filter of advancing circuit and delay circuit as shown in FIG. 5.

The unit delay circuit to delay a signal by a unit time τ is considered. The following signal is introduced to this circuit.

$$f(t) = \exp(j\omega t) \ (j: \text{imaginary unit})$$

Then naturally the signal is delayed by a unit time τ and the output signal becomes as follows.

$$f(t - \tau) = \exp\{j\omega(t - \tau)\}$$
$$= \exp(-j\omega\tau)\exp(j\omega\tau)$$
$$= \exp(-j\omega\tau)f(t)$$

That is, the complex sine wave f(t) is multiplied by $\exp(-j\Omega\tau)$. This means that transfer function of the unit delay circuit in the angular frequency domain is nothing less than $\exp(-j\Omega\tau)$. Therefore, the transfer function of the circuit to delay a signal by t=nτ is $\exp(-jn\omega\tau)$. From this fact, it can be realized directly that the transfer function of FIR filter shown in FIG. 5 is as follows.

$$H(\omega) = \Sigma_{n=-N}^{N} kn \cdot \exp(-jn\omega\tau)$$

Therefore, the transfer function of FIR filter turns into complex Fourier series. Complex Fourier series can approximate almost all functions in the frequency band of $-\pi < \omega\tau < \pi$ in sufficient accuracy in a practical range if the limit N of total is increased and coefficients kn (n=−N, −N+1, . . . , N) are chosen well. Therefore, FIR filter can be either a low-pass filter or a band-pass filter in the frequency band of $-\pi < \omega\tau < \pi$ according to the chosen tap number and coefficients of the FIR filter.

As the transfer function of FIR filter is Fourier series, the transfer function of FIR filter is a periodic function of $2\pi$ period having the fundamental period in the frequency band of $-\pi < \omega\tau < \pi$. In the digital signal processing, the frequency band of the fundamental period is mainly used. Therefore, the input signal f(t) is also the band-bound signal of Fourier spectrum bound in $-\pi < \omega\tau < \pi$ or the band-bound signal approximately bound in this band. However, this condition is not necessarily satisfied if the error accompanied with approximation can be accepted. The error may become large depending upon the difference if the condition is quite different.

FIR filter bank is explained. FIR filter bank is a system as shown in FIG. 6 as an array of FIR low-pass filters, band-pass filters or high-pass filters. The analysis filter and synthesis filter are FIR filters, respectively. The analysis filter sometimes works to divide the input signal f(t) into several bands of narrow frequency region called sub-band. The sub-band is sometimes used for data compression for example in the case of calculation saving for digital numerical processing. For example, the output signal of each sub-band is approximately represented in given finite digit binary fractions etc. If the output of one sub-band is small for some time sequence, it is approximately turned to 0. Thus the data is compressed. As FIR filter can realize many kinds of transfer functions, the transfer functions of observing instruments and sensors can be represented using the models of analysis filters as shown in FIG. 6.

Output signal passed through the analysis filter is sampled at each sample point t=nT (n: integer) arranged periodically on the time axis with interval T. Thus the sample value fm(nt) (n: integer, m: pass number) is obtained. These sample values are partial information on f(t). Therefore, in general, the sample values cannot determine f(t) uniquely. Under some condition, the sample values can determine f(t) uniquely.

Such condition and the restoring formula from g(t) to f(t) is the sampling theorem. Here, if without notice, it is assumed that the sample values cannot determine f(t).

At the sample points corresponding to these sample values or part of them, the sample value is entered into FIR filter of synthesis filter in turn. The resultant output of the synthesis filter is summed up with the adder circuit at last and then it becomes the final output g(t). The output g(t) is required to be approximated close to the input f(t) as possible. The following fact is self-evident but important. If the input f(t) is known only one, without such complicated approximation as this, f(t) can be presented as g(t) previously. Naturally, the approximation error is as follow.

$$e(t)=f(t)-g(t)=f(t)-f(t)=0$$

Such a trivial case is not treated here. On the contrary, if f(t) can vary much, f(t) cannot be restored with the sample values of partial information of f(t). That is, the function value at the sample point becomes the sample value. But, there are many signals that have values of very big change at the other points than the sample points. Therefore, it is actually impossible to approximate such signals.

Therefore, it is required to set up a suitable set of signal f(t) and to consider the optimal approximation to the set. Even though an approximate formula is very good, if it is good only for a known specific signal, the argument will relapse into the above-mentioned argument. It should be considered to improve approximation performance on the whole to a signal f(t) belonging to a determined signal set.

Then, the target measure and problem of a maximum error are described a little more correctly. Now suppose that a signal set and a certain approximate function for the signal belonging to the signal set are given. The signal set is written as $\Xi$. The approximation result is written as g(t). The approximation error is written as e(t). Further, suppose that the approximation formula is to approximate the signal f(t) using the sample value fm(nT) of the output fm(t) of the analysis filter Hm($\omega$) with input signal f(t). Here, m=0, 1, 2, ..., M−1. n=$N^m_1$, $N^m_1$+1, $N^m_1$+2, ..., $N^m_2$. $N^m_1$ and $N^m_2$ are given integers defined according to the number m of the analysis filter Hm($\omega$). $N^m_1$ and $N^m_2$ may not be dependent on the number m of the analysis filter Hm($\omega$). Then let $N^m_1$=$N_1$ and $N^m_2$=$N_2$. Under that condition, the measure of a maximum error is defined as follows.

The measure of the maximum error: the given signal set is written as $\Xi$. The approximation result is written as g(t). The approximation error is written as e(t). Moreover, suppose that a positive function $\beta[e(t)]$ of error e(t) is defined. The function may generally be an operator or a functional. Here, consider the approximation error e(t) of the signal f(t) for all over the signal f(t) belonging to the signal set $\Xi$. The maximum of $\beta[e(t)]$ according to these e(t) is written as follows.

$$E\max(t)=\sup\{\beta[e(t)]\}\text{(the range of sup is }f(t)\epsilon\Xi)$$

It is called the measure of the maximum error. The measure of the maximum error Emax(t) is defined at each time t.

Here, consider the problem to find the synthesis filter to minimize all of the above-mentioned measure of the maximum error together at the same time when the set $\Xi$ of input signal f(t), the interval of the sample points, the transfer function of the analysis filter and the number of taps of the synthesis filter are given. This approximation formula is called the optimum approximation formula hereafter. Moreover, as this approximation formula minimize all of the measure of the maximum error at the same time, naturally, it minimizes the measure of the maximum error Emas(t) without $\beta$ as follows.

$$E\max(t)=\sup\{|e(t)|\}\text{(the range of sup is }f(t)\epsilon\Xi)$$

When this approximation formula to minimize the measure of the maximum error can be found uniquely, the approximation formula is exactly the approximation formula itself that is found easily by reason of uniqueness of the approximation formula. Is it actually possible?

Existence of undefeatable approximation under some conditions is explained. Here, it is shown first that the approximation formula to satisfy two conditions is the optimal approximation formula mentioned above. Now, suppose that the approximation formula to satisfy the following two conditions exists to certain signal set $\Xi$.

Condition 1: When the approximation formula is used, the approximation error e(t) to f(t) in the signal set $\Xi$ belongs to the signal set $\Xi$. That is, the set $\Xi$ contains the set $\Xi$e of approximation error e(t) corresponding to the approximation formula.

Condition 2: Consider the approximation error e(t) as a signal since e(t) belongs to the signal set $\Xi$. Suppose that the optimal approximation formula is applied to the signal e(t). The sample value em(nT) of the output em(t) of the analysis filter Hm($\omega$) is 0 altogether when impressing e(t) to the analysis filter. Here, m=0, 1, 2, ..., M−1. n=$N^m_1$, $N^m_1$+1, $N^m_1$+2, ..., $N^m_2$. $N^m_1$ and $N^m_2$ are given integers defined according to the number m of the analysis filter Hm($\omega$).

Now, it is shown that the given approximation formula is the optimal approximation formula mentioned above when it satisfies the two above-mentioned conditions. FIG. 7 shows the candidates of the optimal approximation formula and other approximation formula. The upper half of FIG. 7 corresponds to the optimal approximation formula. The lower half is other approximation for comparing. As shown in FIG. 7, each approximation formula is g(t) and y(t). Corresponding approximation errors are e=e(t) and E=E(t). Since errors e and E are determined by input f(t), they can be written as e(f, t) and E(f, t).

For simplicity, the optimal approximation is called our approximation and other approximation is called their approximation. At this time, the result shown in FIG. 8 is obtained when the approximation error e=e(t)=e(f, t) of our approximation is input as a signal into the analysis filter. As shown in FIG. 8, according to the condition 2, since the sample value is 0 when the signal f=e is input into the analysis filter, in this case, the resultant data through the analysis filter is nothing. Then, as an appropriate assumption, the approximation formula of their approximation at that time is assumed 0(t)=E(f, t)=E(e, t)=0. Then, as shown in FIG. 8, it holds about their error that E(e, t)=e(f, t)−0(t)=e(f, t)=e. As a result, the inequality shown That is, the maximum (upper limit) of their approximation error E=E (f, t) when the signal f=f(t) is varied in the original signal set $\Xi$ does not increase naturally if the range to select f is reduced from $\Xi$ to $\Xi$e form the definition of upper limit. Therefore, the second formula in FIG. 9 holds. On the other hand, from FIG. 8, $$E(e,t)=e(f,t)-0(t)=e(f,t)=e$$

Therefore, the fourth formula holds. By the way, according to the corresponding relation between the signal f and the error signal e, to search for the upper limit of $\beta[e(t)]$ changing the signal e=e(t)=e(f, t) in the set of error signal e(f, t) is the same as to search for the upper limit of $\beta[e(t)]$ changing the signal f=f(t) in the signal set $\Xi$. Accordingly, the last fifth formula can be obtained. Notice the first formula and the fifth formula.

Then, it turns out that our approximation has always the measure of approximation error not greater than their approximation. Thus, it is proved.

It is explained with a concrete example. Now, consider an example to sample merely an input signal at each sample point. In this example, assume the input-and-output characteristic graph of a preprocessing circuit is a straight line of the inclination 1 passing the origin.

Our approximation circuit yields 0 at the sample point when the sample value is 0 and yields the approximation signal of the sour ce signal when the sample value is not 0. That is, at the sample point, the circuit yields the sample value of the signal as it is. At the other point than the sample point, it yields the approximation value as mentioned here. Their approximation circuit yields 0 at the sample point when the sample value is 0. It may yield the value different from the sample value when the sample value is not 0. In this case, as our approximation signal coincides with the source signal at the sample point, the sample values of the approximation error e(t) at the sample points are all 0. Thus, the condition 2 is fulfilled.

When their approximation is applied to this approximation error e(t), as the sample values are all 0, their approximation may be be considered as 0. Then, when their approximation is applied to our approximation error, their approximation error is e(t)−0=e(t) as it is input e(t) minus their approximation formula 0. That is, when the input is e(t), our approximation has the same approximation performance with their approximation. However, when the input is f(t), their approximation may have the approximation error greater than e(t). In this case, it turns out that our approximation could yield better approximation value.

Even though their approximation formula could yield an approximation error less than e(t) concerning the specific input f(t), as the signal f(t)=e(t) exists in the source signal according to the condition 1, if it is selected as the source signal, as their approximation has the error approximation e(t) to such input signal, as far as the upper limit error is adopted, also in this case, our approximation and their approximation have the same upper limit error measure Emax(t)=sup{|e(t)|} (the range is f(t) in the set xi). That is, our approximation has the same or better performance than their approximation in the above-mentioned upper limit error measure.

A general example of preprocessing circuit to perform linear transforms. The input signals f(t) are assumed to be f($\tau$) f($2\tau$), . . . , f(N$\tau$). $\tau$ is a positive constant. This is vector f. The preprocessing circuit is a linear transform circuit of vector f. For example, y=Af. But, A is a matrix of M times N. The M elements of y are the output of the sampling circuit. Postprocessing circuit function is z=By. But, B is a matrix of N times M. In this time, if the output of A after passing A, B and A again is the same as the simple output of only A, that is, if the sample value A(BAf) of output BAf is the same as the sample value Af of input f, i.e. ABAf=Af, the condition 2 is fulfilled. The reason is this. As the error of that time is e=f−BAf, the sample value of the error e is A(f−BAf)=(A−ABA)f. If ABA=A, then the sample value of error e becomes 0. Thus the condition 2 is fulfilled. In this time, the condition that the error e=(A−ABA)f is contained in the set xi of f is the condition 1. The problem is that such conditions are realized.

From the above consideration, there arises a subject "Find the practical signal set to satisfy above-mentioned two conditions and the optimal approximation formula under such conditions." The following signal set is considered as such an example of the first. That is, as shown in FIG. 10, assume that the Fourier spectrum of source signal h(t) is H($\omega$) and the energy of source signal h(t) is less than or equal to given positive number A. This time, it is assumed that the output is f(t) when the source signal h(t) is entered to the filter with given positive transfer function $\sqrt{(W(\omega))}$ and its Fourier spectrum is F($\omega$). As shown in FIG. 10, F($\omega$) will fill the inequality shown in FIG. 10. The set of signal f(t) with F($\omega$) to fill such restrictions is considered as the signal set xi.

The function W($\omega$) is called a weight function. Its example is shown in FIG. 11. For example, h(t) is the function to show the rushing air flow in a lung. The square root of W($\omega$) is the function to show the windpipe of throat. The signal f(t) is the voice out of the mouth. Then the signal approximation can be done when the set of signal f(t) is considered as a set of voice. At this time, $\omega$c in FIG. 11 is corresponding to the approximate cutoff frequency of voice, for example, 4 kHz. In this case, if the sample points are fixed at finite numbers, the optimum approximation formula to satisfy the conditions 1 and 2 can be found. The approximation formula uses the synthesis filter $\Psi$m, n($\omega$) with different function scheme at each sample point. m is path number. n is the number of sample point. It is different with the circuit in FIG. 6 that the filter is different at each sample point. The optimum filter $\omega$m, n($\omega$) is restricted in the frequency range of $-\pi < \omega\tau < \pi$. $\tau$ is the sampling period of the source signal. It is almost always 1/M of the sample point interval T. If it is not satisfied, though the approximation is not broken, but the error may increase.

In this case, as the impulse response $\phi$m, n(t) of the synthesis filter $\Psi$m, n($\omega$) has an infinite length, actually, it is used by discontinuing at the finite fixed time width. Therefore, this approximation is the approximation in that time width. In this case, as the impulse response $\phi$m, n(t) is restricted in that time width, when the discrete approximation is performed, the impulse response $\phi$m, n(t) can be realized as the FIR filter with finite taps. At this time, the measure of the approximation Emax(t)=sup{|e(t)|} (the range of sup is defined as that f(t) is in xi) is expressed in integral as follows.

$$Emax(t) = (\sqrt{A})/(2\pi) \{ \int_{-\infty}^{\infty} W(\omega)^2 \times |\exp(j\omega t) - \sum_{m=0}^{M-1} \sum_{n=N1}^{N2} \phi m, n(t) Hm(\omega) \exp(j\omega nT) |^2 d\omega \}^{1/2}$$

Here, $\phi$m, n(t) is the impulse response of the optimum synthesis filter.

The method to find the optimum $\phi$m, n(t) concretely is as follows. First, the absolute value of the complex function included in the integral of the measure of the above-mentioned upper limit error is developed with rewriting as the product of the complex function and its conjugate complex function. It is re-arranged with regard to $\phi$m, n(t). As the terms with regard to m, n(t) are not relevant to omega, all of them are getting out of the integral with regard to omega. Therefore, it can be easily differentiate e with regard to $\phi$m, n(t). The above-mentioned measure of error is differentiate with regard to all $\phi$m, n(t) in this way and the results are set as 0. Then the result is a set of simultaneous linear equations.

The terms except $\phi$m, n(t) in that simultaneous linear equations are proportional to the Fourier inverse transform (or its value at the specific time) of W($\omega$)Hm($\omega$)) or the product of W($\omega$)Hm($\omega$) and the complex conjugate of Hm($\omega$). Then, the high-speed calculation method of Fourier inverse transform as FFT can be utilized for it. By solving this simultaneous linear equations, the optimum $\phi$m, n(t) can be obtained. Though the detail discussion is omitted, at this time, the coefficient matrix of the concerned simultaneous linear equations becomes the constant matrix. Once it is calculated, then it is sufficient only to memorize the values. It should be noted that the re-calculations at every t interval are not necessary.

And also, once someone calculates φm, n(t) itself primarily, others should use only the values at all.

And, the point that the equation to derive φm, n(t) becomes as simultaneous linear equations is very advantageous on numerical computation. Actually, the point that the high-speed calculating method such as LU method is available is an advantageous point of the computer software of this approximation. The fact that the impulse response of the band-restricted synthesizing filter with such many advantages minimizes the measure of maximum error simultaneously all together is very important.

The above-mentioned first example is a result in case the finite number of sample points is fixed. Next, as the second example, the approximation in the case of the usual filter bank using FIR filters as shown in FIG. 6 is explained. The signal set in this case should be corresponding to such signal set in the case that the frequency band shown in FIG. 10 and FIG. 11 is expanded to $-(T+M)\pi \leq \omega T\tau \leq (T+M)\pi$. At this time, the impulse responses of the synthesizing filter $\Psi m(\omega)$ with the following feature are derived. φm(t) (m=0, 1, 2, ..., M−1) is restricted in the above-mentioned expanded band. At the discrete time t=nτ (n is an integer), φm(nτ) (m=0, 1, 2, ..., M−1) is 0 at the time over the given finite time width. Therefore, φm(t) (m=0, 1, 2, ..., M−1) is realized as an FIR filter with finite taps when it is used only at the discrete time t=nτ (n is an integer). Moreover, importantly, it can be demonstrated that this approximation formula to use φm(t) (m=0, 1, 2, ..., M−1) satisfies the condition 2.

As mentioned above, in this case, as long as the argument is limited to so-called discrete approximation that is aimed at the approximation in discrete time t=nτ (n is an integer), it is focused on whether there is any practical signal set that satisfies conditions 1. The sufficiently practical signal set is actually obtained in the form extended to the multi-dimension signal.

The application to digital multiplex communication system is explained. The case of signal approximation corresponding to above-mentioned second example is shown as FIG. 12 with the example of 2-pass filter bank. In FIG. 12, the input signal is sampled with the interval T after passing the analysis filter. As the result of it, so-called aliasing phenomenon arises. As shown in the center of FIG. 12, just after the sampling at the midpoint of the filter bank, the overlap of spectrum arises. As the result, as shown in the lower part of FIG. 12, the simultaneous linear equations hold with the variables of $F(\omega)$ and $F(\omega_0-\omega)$. Therefore, if it can be solved, $F(\omega)$ and $F(\omega_0-\omega)$ are calculated from the overlapped spectrum obtained by sampling at the midpoint of the filter bank. At this time, in order to solve these simultaneous equations, the determinant of a coefficient matrix needs to serve as non-zero. This is called the condition of independence of the analysis filter. The pass number is assumed as 2, but, it is also the same as in the case of more than or equal to 3.

If the analysis filter is independent, from the sample value just after the sampling at the midpoint of the filter bank, the input signal f(t) can be restored. The analysis filter of such filter bank is connected as shown in FIG. 13. Then, as shown in FIG. 13, assumed that such filter bank has application performance excellent enough, the equation f(t)=g(t) holds. Assumed that the similar signal yields similar output, as shown in FIG. 13, the signals shown with red and green for understanding convenience appear well-separated in the output end. Without the leftmost circuit of FIG. 13, the digital multiplex communication system of good approximation can be realized.

The input signal to such digital multiplex communication system is, in FIG. 13, the sample value of the midpoint of the filter bank, it is naturally certain function or functional of f(t). And also, the output of such digital multiplex communication system is, in FIG. 13, the rightmost sample value, it is naturally the same function or functional of g(t). The discussion is of course on the linear system, the difference between input and output at each channel of such multiplex communication system becomes after all the functional of f(t)−g(t). By the way, in the case of above-mentioned second example, this approximation minimizes the upper limit of any functional of e(t)=f(t)−g(t). Therefore, after all, this approximation minimizes the upper limit of any operator, functional or function of the difference between the input and output at each channel of the multiplex communication system. That is, this approximation is also very advantageous in the design of the multiplex communication system. Besides, note that the time pitch of input and output of such multiplex communication system is T.

The analysis filter is, if the condition of independence is fulfilled, able to set up wide enough in band. Its computing software is simple as FFT or linear computing. Therefore, for example, even if the transmission characteristic of a circuit changes at disaster, the changed circuit characteristic is considered to be an analysis filter, by easy calculation, finding the optimal synthetic filter for moment, and the situation can be coped with flexibly. Especially, the digital multiplex communication system to use this approximation is the circuit shown in the right of FIG. 13. Therefore, the rightmost circuit is, as filter bank, the filter used as the analysis filter. And the center circuit is, as such digital communication system, corresponding to input circuit. This is, in the filter bank, corresponding to the synthesizing filter. That is, the optimum design of such digital multiplex communication system is the problem that the transmission filter (corresponding to analysis filter at the filter bank) at the broadcasting station is optimized with given receiving filters (corresponding to the analysis filter at the filter bank) at many users. In this meaning, it is suitable to the object to enable to cope with the situation flexibly, even if the transmission characteristic of a circuit changes at disaster, the changed circuit characteristic is considered to be an analysis filter, by finding the optimal synthetic filter for moment by easy calculation.

This inventor proposed the approximation method to interpolate a multidimensional signal in nonpatent document 1. By this approximation method, an incoming signal is sampled at discrete sample points after passing a preprocessing filter. From the obtained sample value, an incoming signal is presumed in approximation. The error between the incoming signal and the reproduction approximation signal is the minimum with wide variety of measures of error.

This inventor proposed the optimum discrete approximation of band-limited signals in nonpatent documents 2 and 3. In nonpatent document 4, the optimum interpolation and design of linear phase filter banks was proposed. In nonpatent documents 5, 6, 7, and 9, the optimum approximate restoration of multi-dimensional signals was proposed. In nonpatent documents 8, 10, and 11, interpolatory estimation of multi-dimensional orthogonal expansions was proposed. The optimal linear interpolation was proposed in nonpatent documents 12, 13, and 14.

Nonpatent document 1: Takuro Kida: "Theory of Generalized Interpolation Approximation of Multi-Dimensional Signals", Journal of Signal processing, Vol. 6, No. 1, pp. 3-8, January 2002, No. 2, pp. 71-77, March 2002, No. 3, pp. 137-141, May 2002.

Nonpatent document 2: Y. Kida and T. Kida, "The Optimum Discrete Approximation of Band-Limited Signals without Necessity of Combining the Set of the Corresponding Approximation Errors," IEICE Trans. Fundamentals, Vol. E85, No. 3, pp. 610-639, March 2002.

Nonpatent document 3: Y. Kida and T. Kida, "The Optimum Discrete Approximation of Band-Limited Signals with an Application to Signal Processing on Internet," IEICE Trans. Fundamentals, Vol. E82-A, No. 8, pp. 1592-1607, August 1999.

Nonpatent document 4: T. Kida and Y. Kida, "Consideration on the Optimum Interpolation and Design of Linear Phase Filterbanks with High Attenuation in Stop Bands," IEICE Trans. Fundamentals, Vol. E81-A, No. 2, pp. 275-287, February 1998.

Nonpatent document 5: T. Kida and Y. Zhou, "The Optimum Approximate Restoration of Multi-Dimensional Signals Using the Prescribed Analysis or Synthesis Filter Bank," IEICE Trans. Fundamentals, Vol. E79-A, No. 6, pp. 845-863, June 1996.

Nonpatent document 6: T. Kida, "The Optimum Approximation of Multi-Dimensional Signals Based on the Quantized Sample Values of Transformed Signals," IEICE Trans. Fundamentals, Vol. E78-A, No. 2, pp. 208-234, February 1995.

Nonpatent document 7: T. Kida, "On Restoration and Approximation of Multi-Dimensional Signals Using Sample Values of Transformed Signals," IEICE Trans. Fundamentals, Vol. E77-A, No. 7, pp. 1095-1116, July 1994.

Nonpatent document 8: T. Kida, S. Sa-Nguankotchakorn, K. Jenkins, "Interpolatory Estimation of Multi-Dimensional Orthogonal Expansions with Stochastic Coefficients," IEICE Trans. Fundamentals, Vol. E77-A, No. 5, pp. 900-916, May 1994.

Nonpatent document 9: T. Kida, "The Optimum Approximation of Multi-Dimensional Signals Using Parallel Wavelet Filter Banks," IEICE Trans. Fundamentals, Vol. E76-A, No. 10, pp. 1830-1848, October 1993.

Nonpatent document 10: T. Kida, S. Sa-Nguankotchakorn, "Generalized Optimum Interpolatory Estimation of Multi-Dimensional Orthogonal Expansions with Stochastic Coefficients," IEICE Trans. Fundamentals, Vol. E75-A, No. 12, pp. 1793-1804, December 1992.

Nonpatent document 11: T. Kida, H. Mochizuki, "Generalized Interpolatory Approximation of Multi-Dimensional Signals Having the Minimum Measure of Errors," IEICE Trans. Fundamentals, Vol. E75-A, No. 7, pp. 794-805, July 1992.

Nonpatent document 12: Takuro KIDA and Hiroshi MOCHIZUKI: "A Systematic Consideration on the Superiority of Generalized Linear Interpolation Approximation," IEICE Trans., Vol. J75-A, no. 10, pp. 1556-1568, October 1992.

Nonpatent document 13: Takuro KIDA and Somsak SA-NGUANKOTCHAKORN: "Study of Generating Function of Sampling Theorem and Optimum Interpolation Functions Minimizing Some Kinds of Measures," IEICE Trans., Vol. J74-A, no. 8, pp. 1332-1345, August 1991.

Nonpatent document 14: Takuro KIDA, Leopoldo Hideki YOSHIOKA, Sadayoshi TAKAHASHI and Hajime KANEDA: "Theory on Extended Form of Interpolatory Approximation of Multi-dimensional Waves," Elec. and Comm. Japan, Part3, 75, no. 4, pp. 26-34, 1992 and IEICE Trans., vol. 74-A, no. 6, pp. 829-839, June 1991.

Nonpatent document 15: Yuichi Kida and Takuro Kida: "Theory of the optimum approximation of vector-signals with some applications," The 2004 IEEE International Midwest Symposium on Circuits and Systems (MWSCAS 2004). July 2004.

DISCLOSURE OF INVENTION

Figure 1:
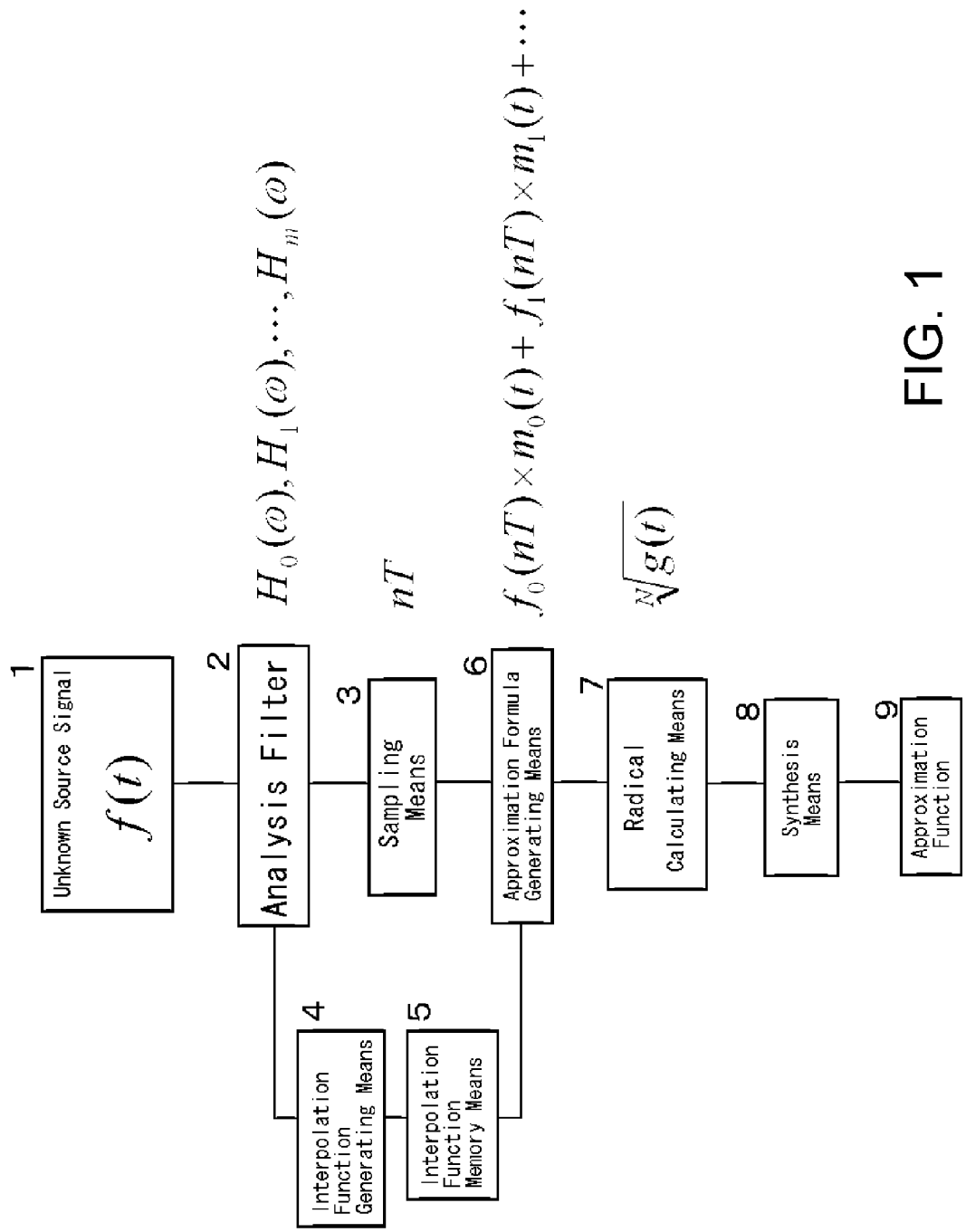
FIG. 1 There is shown a conceptual drawing of discrete signal approximation system in the embodiment of this invention.

Problem to be Solved by the Invention

But, in the conventional discrete signal interpolation system, there is a problem that the approximation formula cannot be found in the case of non-linear analysis filter. At a glance, it seems good that inverse transform of nonlinear conversion is performed before a synthetic filter, after that, the synthetic processing with the usual filter bank is performed. But, trying to find $y(mT)$ from the sample value $v(mT)=a\{y(mT)\}^2+by(t)$ of the source signal $v(t)=a\{y(t)\}^2+by(t)$, since a quadratic equation generally has two solutions, two $y(mT)$ is generally obtained. So, it is unknown that either value of them could be adopted.

To avoid this, in the source signal $v(t)=a\{y(t)\}^2+by(t)$, if the positive portion of $y(t)$ only is used, naturally, the case of negative $y(t)$ cannot be expressed. The situation to choose either of two arises at every sample value of each source signal. If the sample points to use for every signal are about 30 points. The huge number of cases of the 30th power of 2 will arise. If the source signal differs, the choice of one of the two will differ. Since the source signals are countless, it cannot become the realistic approximation method at all.

For example, though it is considered that approximation should just adopt the better one comparing with the source signal, in this approximation problem, it is assumed that the source signal is unknown. If the source signal is known, without approximation, what is necessary is just to use the source signal itself. It will become an obvious problem. Since the source signal is unknown, it is not able to decide how to choose one out of the large number of approximations. That is, the means is meaningless to synthesize with the usual filter bank after the inverse transform of nonlinear conversion.

Furthermore, when such condition is imposed that some part of the interpolation function is the same each other, by expressing the formula with summarizing the part, the sum of nonlinearly converted value at different sample points is multiplied by the interpolation function. At this time, the inverse transform of nonlinear transform needs to be performed for all over the sum nonlinearly transformed value at the different sample points. As a result, it is needed to find all the solutions by solving the simultaneous nonlinear equations. Generally, the solution is very difficult. If the solutions are plural, the cases should be divided at each sample points and source signals. Therefore, it cannot be solved at all.

Then, the partial approximation signal is found at each calculation. Its spectrum is investigated. One certain solution is chosen out of the plural of candidates of sample value. This process is performed sequentially. After many solutions, the different solution should have be chosen in spite of the already adopted solution far before. Such conclusion may arise. It cannot be known when it was mistaken. When changing the source signal and the sample value, it should be refrained infinitely.

The object of this invention is to solve the above problem to realize the system or method that the approximation formula can be found even though the analysis filter of the approximation system is nonlinear.

Means to Solve the Problem

In order to solve the above-mentioned problem, a signal approximation system in this invention is constructed as follows. The signal approximation system comprises non-linear analysis filters to convert the source signal, a sampling means to sample the output signal of said non-linear analysis filter to make discrete signal at every sampling timing of constant interval, synthesis filters to generate a first approximation function with linear combination of interpolation functions with said discrete signal as coefficients, a means to obtain a second approximation function by calculating the radical of said first approximation function at the sampling timing, a means to calculate an approximation function of said source signal by composing said second approximation functions; wherein said source signal is equivalent to the reversed signal of the spectrum whose norm is less than the given value, said non-linear analysis filter is a filter to yield the signal as described by the polynomial of the transformed signal from the source signal by linear filters, said interpolation function is the function according to said polynomial, said synthesis filter is a filter to generate said first approximation function of approximation of said source signal or its powered function by way of linear combination of said interpolation function with the coefficient of said discrete signal at every sampling timing.

Advantages of the Invention

As constructed above in this invention, the optimum approximation formula of the source signal can be obtained even though the analysis filter is non-linear.

The most favorite embodiment of the invention

Hereinafter, the most favorite embodiment of this invention is explained with reference to FIGS. 1 through 4.

Embodiment

The embodiment of this invention is the signal approximation system constructed as follows. Source signal of bounded norm is entered to analysis filters of FIR filters to yield such output signal as expressed with a polynomial of the converted source signal through a unit filter. The output signal is sampled regularly to make a discrete signal. An interpolation function is calculated according to the characteristics of the multidimensional linear filter that yields the signal expressed as the multidimensional function corresponding to the polynomial. The discrete signal is used as coefficients of linear combination of the interpolation functions by synthesis filters of FIR filters to generate the first approximation function of power function of the source signal. The radical of the first approximation function is calculated to obtain the second approximation functions at every sampling timing. The approximation function of the source signal is obtained with composition of the second approximation functions.

FIG. 1 shows the concept of the structure of the discrete signal approximation system of the embodiment of this invention. In FIG. 1, the source signal 1 is the unknown signal to be approximated. It is equivalent to the signal derived by the inversion from the spectrum with the norm less than or equal to the specific value. The analysis filter 2 is the filter constructed of unit FIR filters with combination of the multiplier and the adder circuits. It yields the signal expressed as the polynomials of the converted signals of the source signal by the unit filter. The sampling means 3 is the means to sample the output signal out of the analysis filter at constant timing.

The interpolation function generating means 4 is an operation means to calculate the interpolation function according to the characteristics of the multidimensional linear filter to yield the signal expressed as the multidimensional function corresponding to the polynomials expressing the characteristics of the analysis FIR filter 2. The interpolation function memory means 5 is a memory to hold the generated interpolation function. The approximation function generating means 6 is the FIR filter to generate the first approximation function of power function of the source signal with linear combination of the interpolation function with coefficient of discrete signal. The radical calculating means 7 is the means to calculate the second approximation function at the timing of every sampling with calculating the radical of the first approximation function. The synthesis means 8 is the means to calculate the approximation function of the source signal with synthesizing all of the second approximation functions. The approximation function 9 is the approximation function of the source signal.

Figure 2:
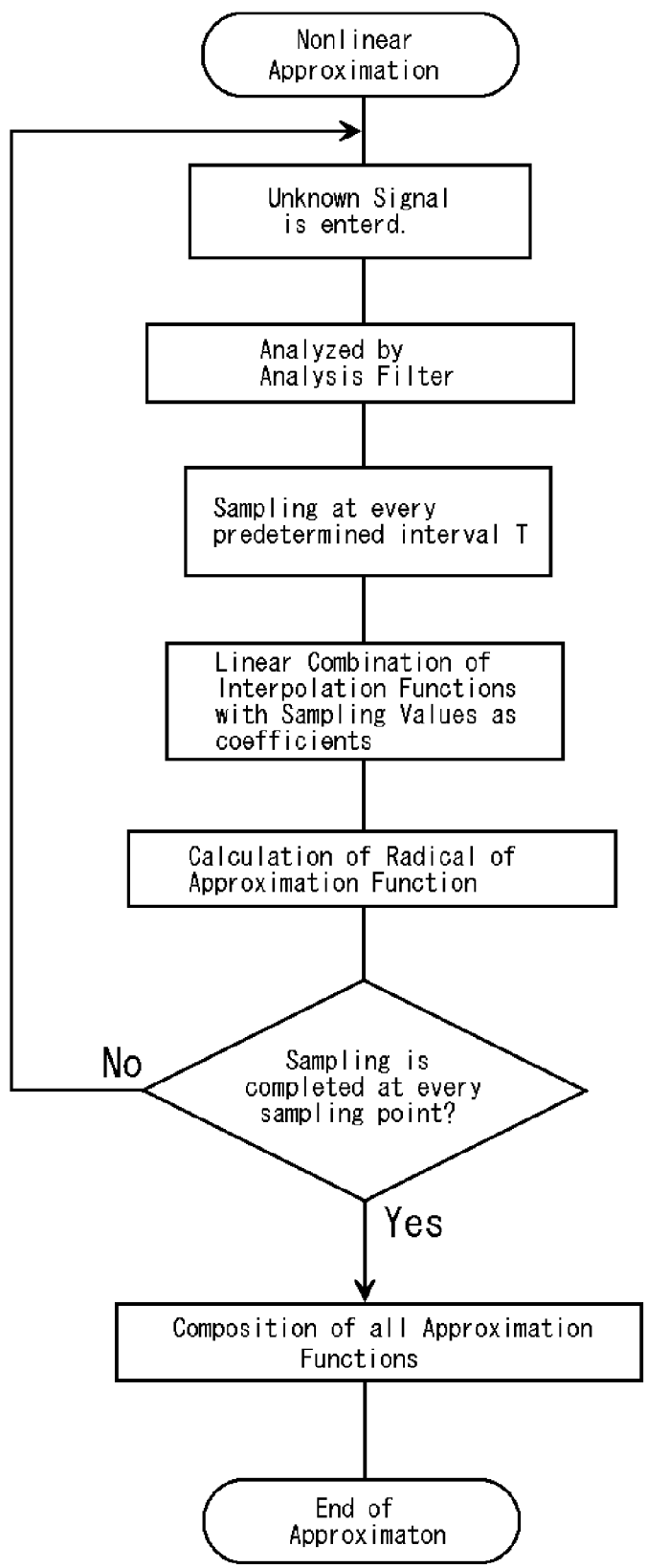
FIG. 2 There is shown a flowchart to show an operational sequence of discrete signal approximation system in the embodiment of this invention.
Figure 3:
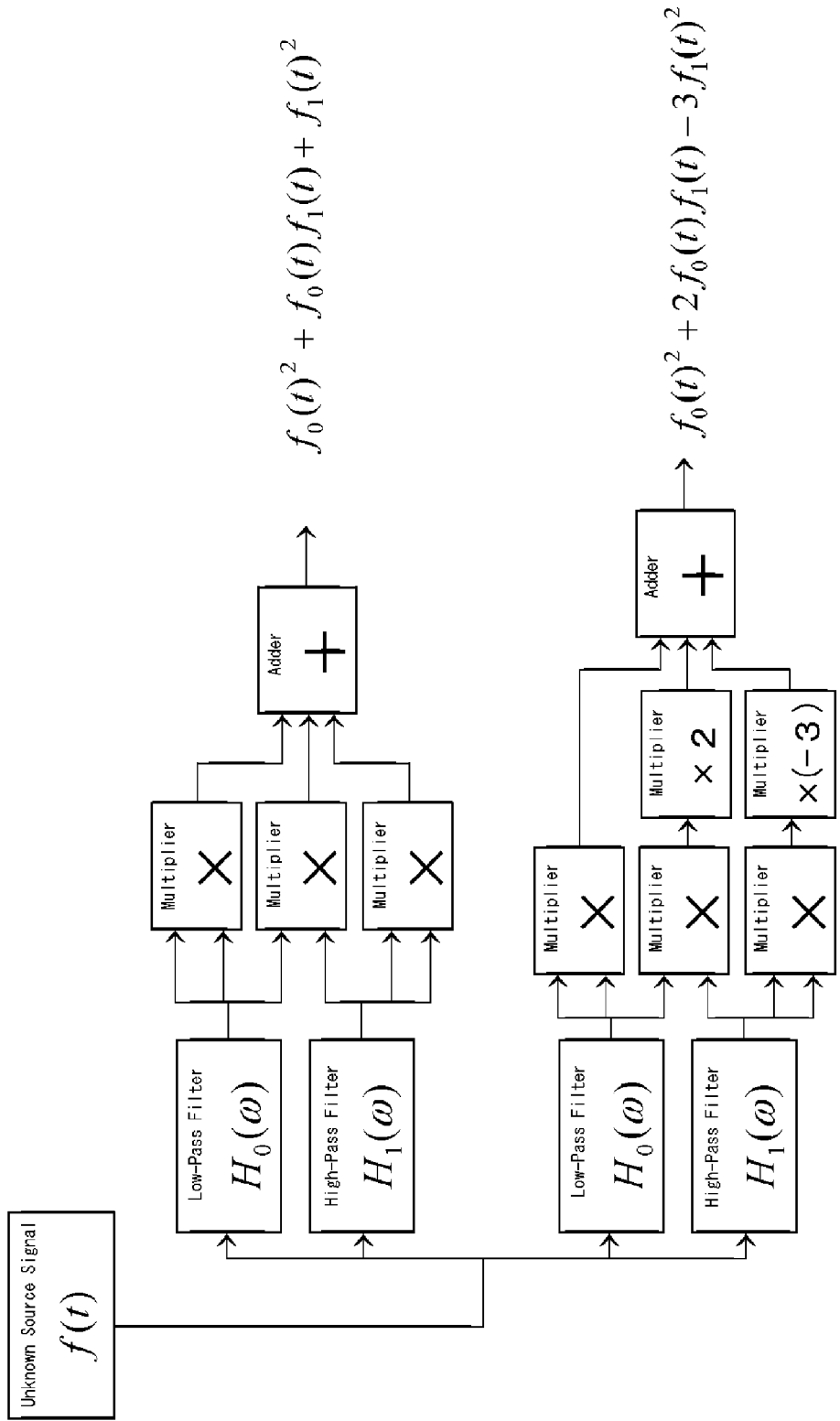
FIG. 3 There is shown an equivalent circuit diagram of analysis filter of discrete signal approximation system in the embodiment of this invention.
Figure 4:
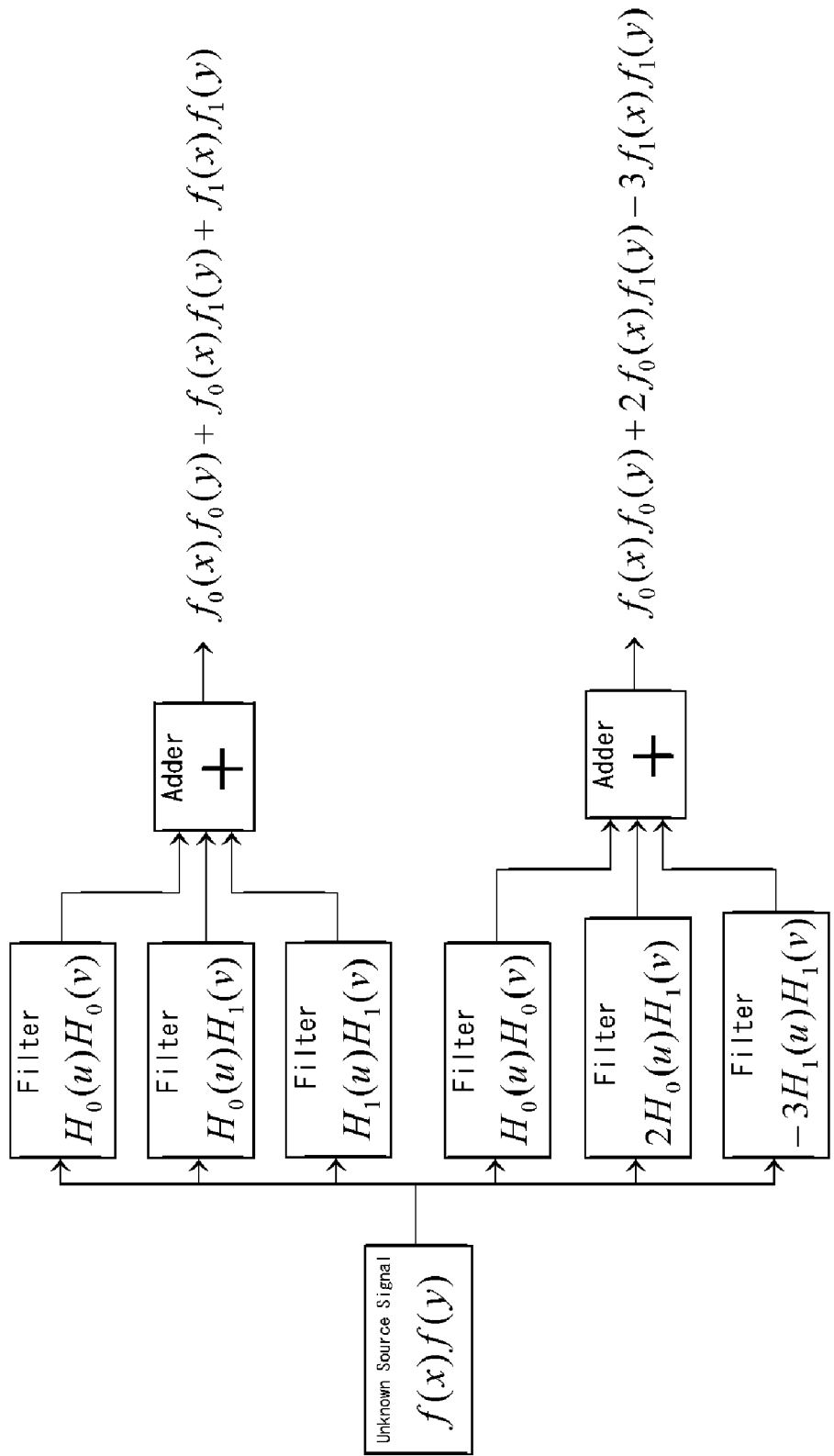
FIG. 4 There is shown an equivalent circuit diagram of multi-dimensional analysis filter of discrete signal approximation system in the embodiment of this invention.
Figure 5:
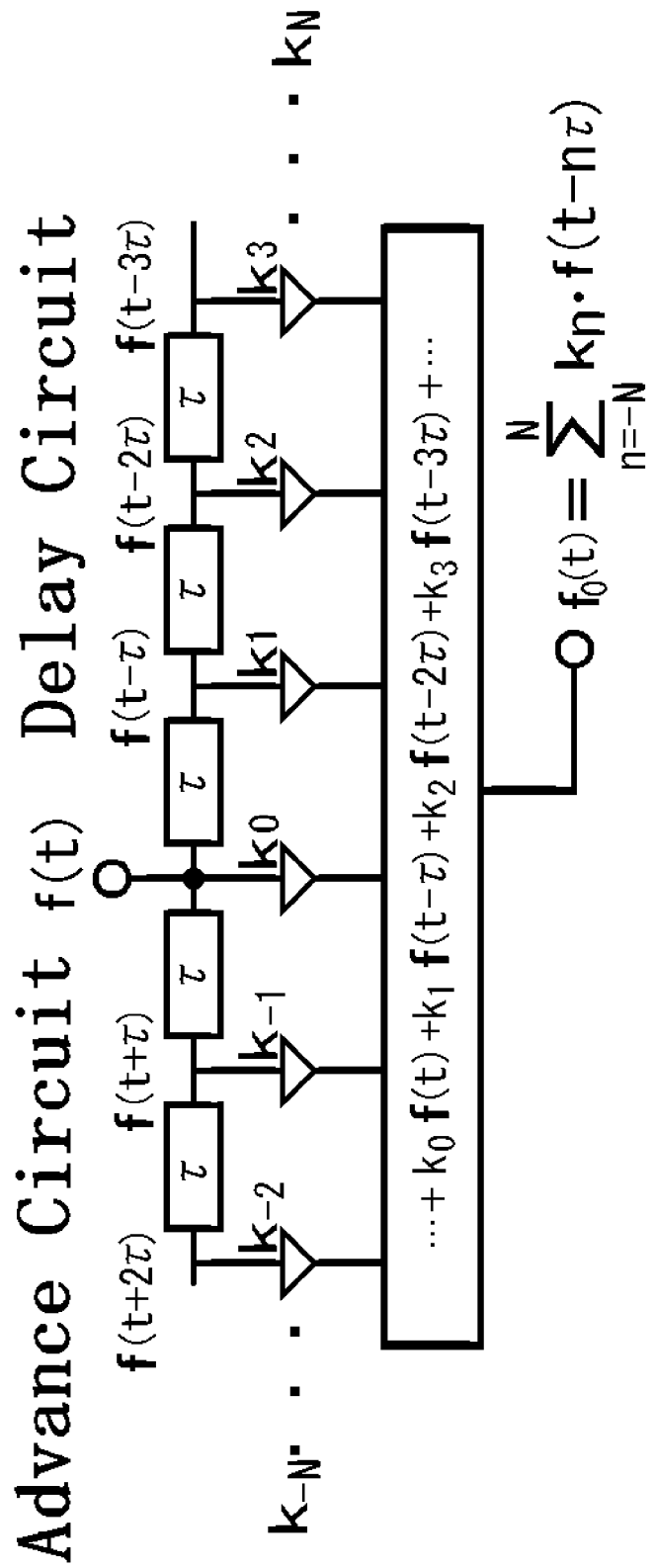
FIG. 5 There is shown an explanatory diagram of FIR filter.
Figure 6:
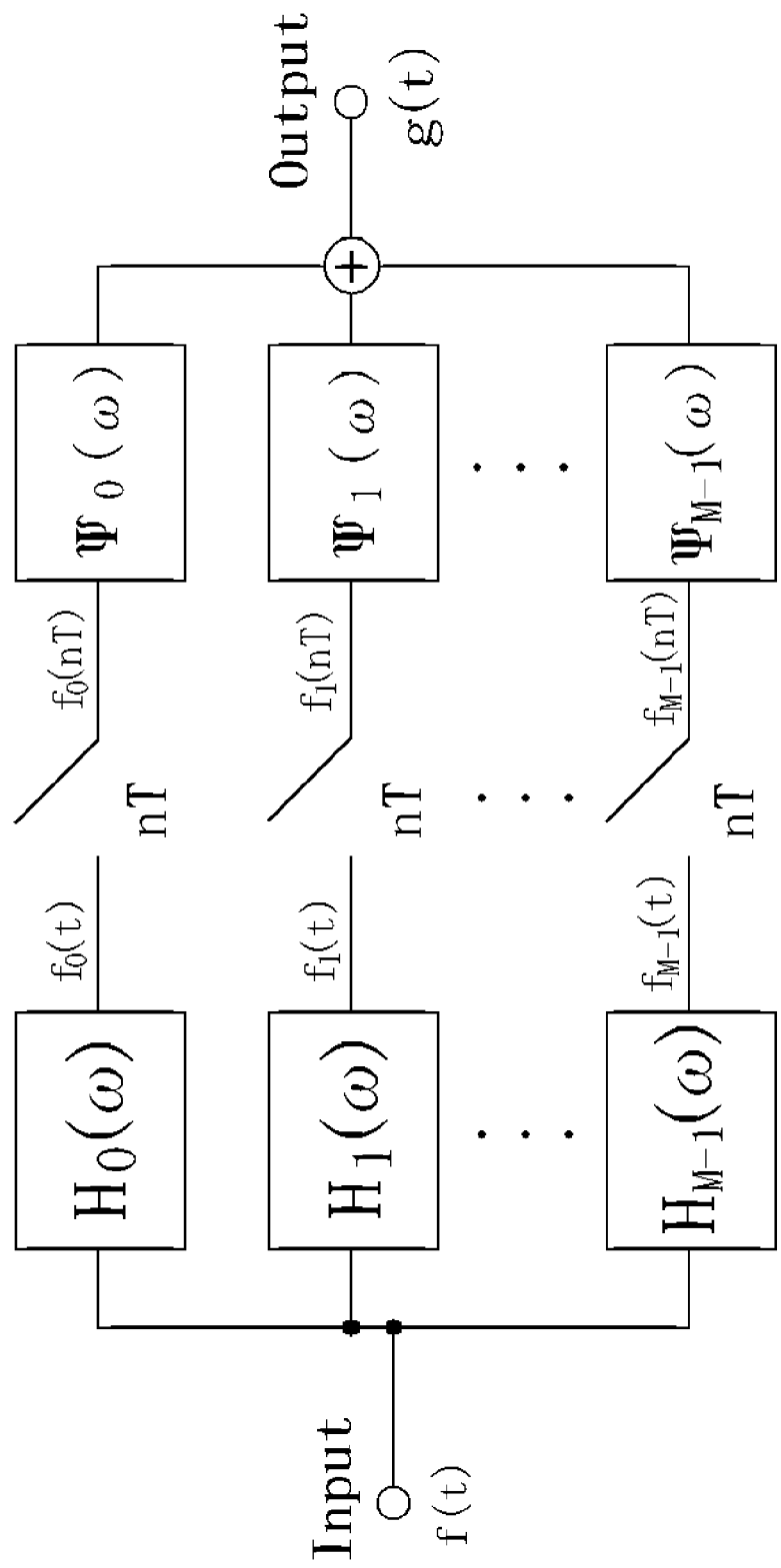
FIG. 6 There is shown an explanatory diagram of FIR filter bank system.
Figure 7:
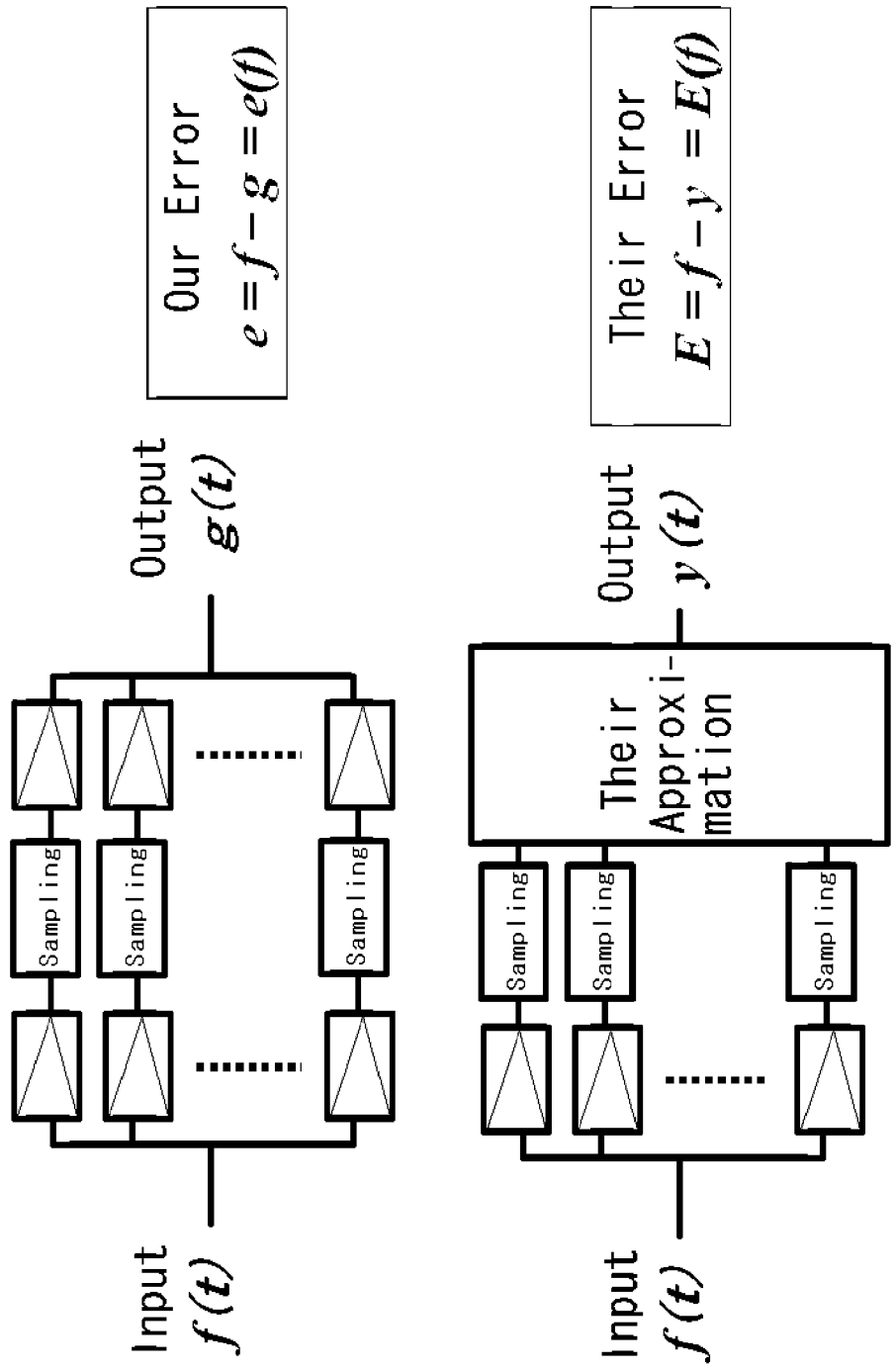
FIG. 7 There is shown an explanatory diagram of candidate of optimum approximation formula and other approximation formula.
Figure 8:
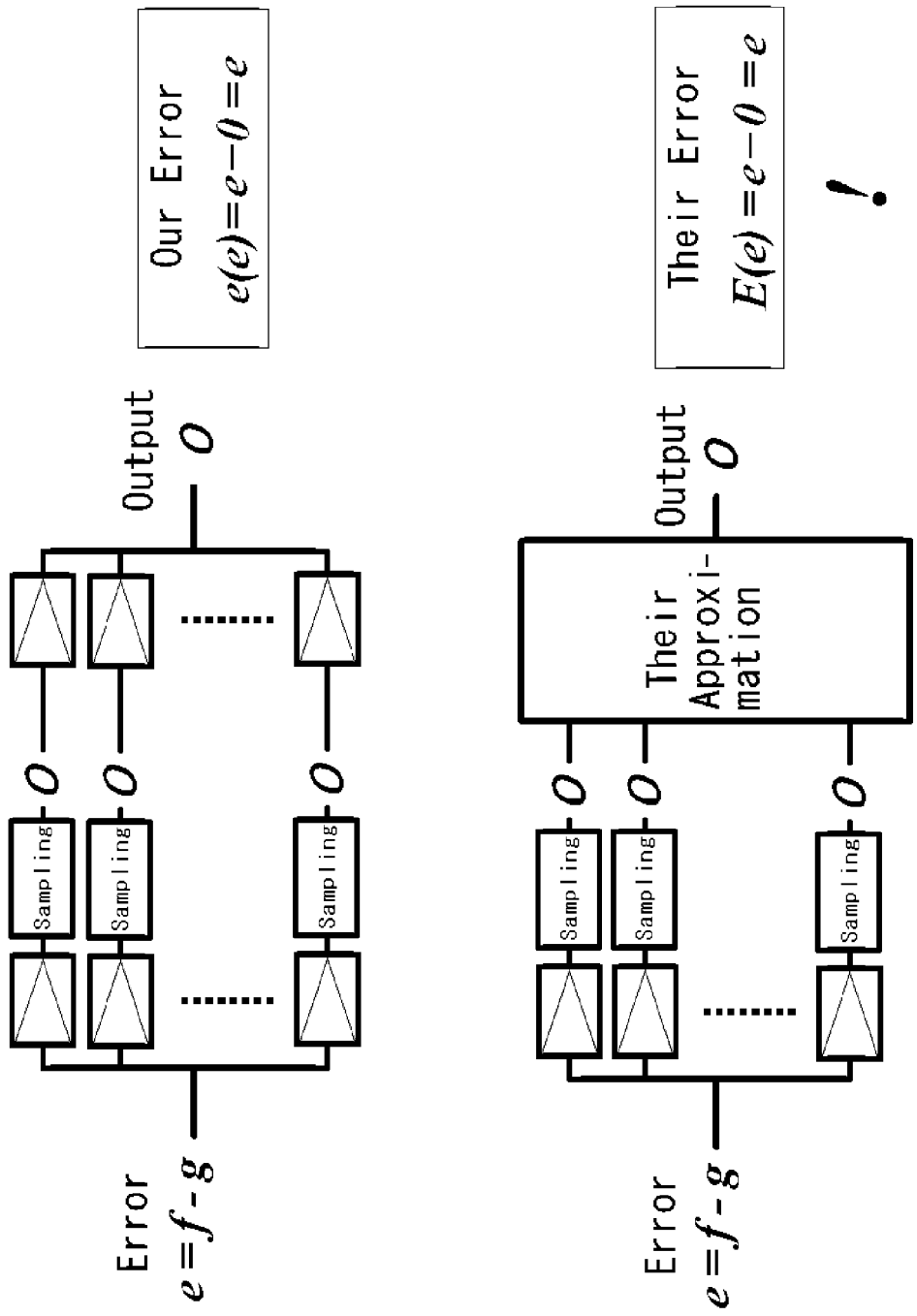
FIG. 8 There is shown an explanatory diagram in case to enter an approximation error signal to an approximation formula.
Figure 9:
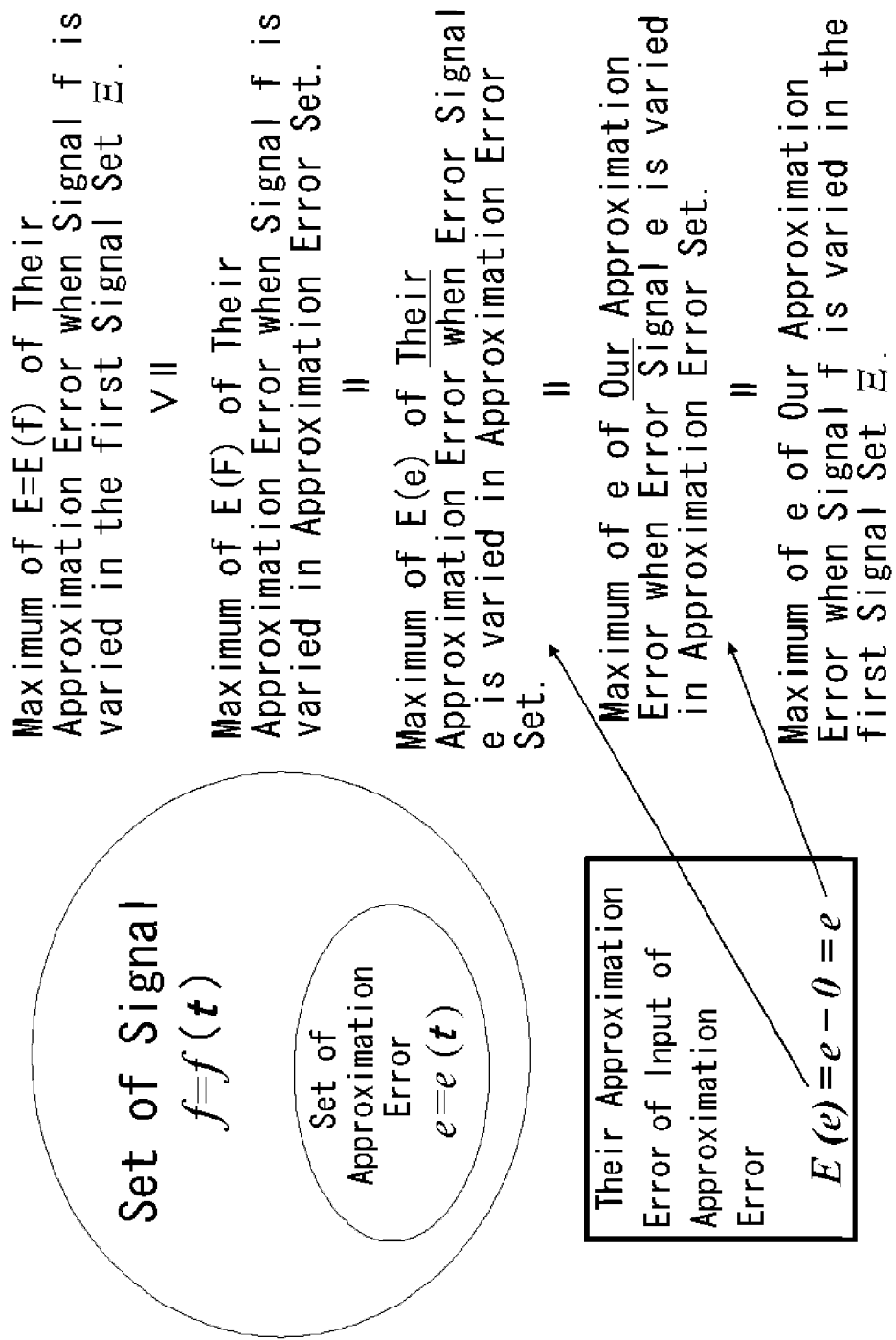
FIG. 9 There is shown an explanatory diagram of inequality to show the optimum of approximation.

FIG. 2 is the flowchart to show the operation sequence of the discrete signal approximation system. FIG. 3 shows the equivalent circuit of the analysis filter of the discrete signal approximation system. FIG. 4 shows the equivalent circuit of the multidimensional analysis filter of the discrete signal approximation system.

First, referring to FIG. 1, the outline of the operation of the discrete signal approximation system in the embodiment of this invention is explained. The source signal 1 is the equivalent signal to the signal derived by the inverse transform from the spectrum whose norm is below the predetermined value. The source signal 1 is transformed with the analysis filter 2 that is the combination of unit filters composed of FIR filter. The analysis filters that are composed of unit filters combined with multiplier circuits and adder circuits yields the signal expressed with a polynomial of the signal transformed form the source signal with the unit filter. The output signal out of the analysis filter 2 is sampled with the sampling means 3 at the sampling timing of constant interval (T) to be a discrete signal.

The multidimensional linear filter corresponding to the analysis FIR filter 2 is assumed. This virtual multidimensional linear filter yields the signal expressed with the multidimensional function corresponding to the polynomial expressing the characteristics of the analysis FIR filter. According to the characteristics of this virtual multidimensional linear filter, the interpolation function is derived with the interpolation function generating means 4. The generated interpolation function is stored in the interpolation function memory 5. At every sampling timing, with the discrete signal as the coefficient, the interpolation function is combined linearly with the approximation formula generating means 6 of the synthesis filter composed of FIR filters to generate the first approximation function of the power of the source signal. With the radical calculating means 7, the radical of the first approximation function is calculated to derive the second approximation function at sampling timing. The approximation function at the sampling timing is synthesized with the synthesizing means 8 to derive the approximation function 9 of the source signal.

Next, referring to FIG. 2, the outline of the operation sequence of the discrete signal approximation system is explained. The unknown source signal whose norm is less than the predetermined value is entered. With the analysis filters composed of FIR filters, the signal expressed with the polynomial of the converted source signal with the unit filter is yielded. The output signal out of the analysis filter is sampled at the predetermined interval to be the discrete signal. According to the characteristics of the multidimensional linear filter to yield the signal expressed with the multidimensional function corresponding to the polynomial, the interpolation function is derived previously. With the synthesis filters composed of FIR filters, the interpolation function is combined linearly with the discrete signal as the coefficient to generate the first approximation function of the power function of the source signal. The radical of the first approximation function is calculated to derive the second approximation function at the sampling timing. This operation is performed every sampling timing and the second approximation function is synthesized to derive the approximation function Next, the principle of the nonlinear approximation method is explained. Before the explanation of the nonlinear approximation, the basic method of the linear approximation is explained with a simple example. Consider the signal f(t) with real coefficients of a, b, c.

$$f(t)=a+b\{\cos(t)\}+c\{\cos(2t)\}$$

As a simple example here, it is restricted as the signal with 3 terms of cosine sequence. Actually, such theory holds in the very wide range. It can be generalized with various orthogonal expansion, Fourier integral transform or analytic function, for example. And, in the former formula, it may be considered that either a, b{cos(t)} or c{cos(2t)} is the disturbance.

By the way, as the condition to restrict the signal set, in this example, it is assumed that the value of (a*a/2+b*b/2+c*c) is less than or equal to 1. The set of f(t) to fulfill such condition is defined as the signal set S. In this case, a, b, and c are restricted in the 3-dimensional ellipsoid, its axis is long in a- and b-directions, and short in c-direction. In practice, by varying the weight, it is necessary to think out the way to adjust the restrictions on the signal set or disturbances to the known data or knowledge.

As a model of known observatory system, the following example is considered. The signal f(t) is assumed to be introduced simultaneously to an ideal low-pass filter and an ideal high-pass filter. They are assumed to yield the following output signals.

$$f0(t)=a+b\{\cos(t)\}$$

$$f1(t)=b\{\cos(t)\}+c\{\cos(2t)\}$$

The filter group to divide the signal frequency band to overlappable subbands is called the analysis filter bank. Its characteristics are arbitral under the condition to fulfill the independency of some kind. The characteristics are assumed known.

Here, consider as the approximation signal of f(t) the signal g(t) expressed with the sample value of f0(t) and f1(t) at t=0.

$$f0(t)=a+b$$

$$f1(t)=b+c$$

$$g(t)=f0(0)m0(t)+f1(0)m1(t)$$

For convenience, m0(t) and m1(t) are called (extended) interpolation function. In this example, the unknowns contained in f(t) are three of a, b and c. Then, the problem is set up as that the signal f(t) is deduced from two sample values less than that 3 unknowns. Of course in more complex generalized form, the number of the sample values and timing points may be allowed to be much more.

Moreover, as it is an example here, it may be given without reason, it is assumed as follows.

$$m0(t)=\{3+\cos(t)-\cos(2t)\}/4$$

$$m1(t)=\{-1+\cos(t)+\cos(2t)\}/2$$

These are substituted for g(t). Then, it becomes as follows.

$$g(t)=p+q\{\cos(t)\}+r\{\cos(2t)\}$$

Provided $$p=(3a+b-2c)/4$$

$$q=(a+3b+2c)/4$$

$$r=(-a+b+2c)/4$$

Again, the signal g(t) is entered to the filter bank, the outputs $$g0(t)=p+q\{\cos(t)\}$$

$$g1(t)=q\{\cos(t)\}+r\{\cos(2t)\}$$

are obtained. Therefore, the equations hold as follows.

$$g0(0)=a+b=f0(0)$$

$$g1(0)=b+c=f1(0)$$

The signal g(t) has the same sample value as the sample value in accordance with f(t).

And also, the signal m0(t) is introduced to the filter bank.

$$m0(t)=\{3+\cos(t)-\cos(2t)\}/4$$

Then m00(t) and m01(t) are obtained respectively.

$$m_0^0(t)=\{3+\cos(t)\}/4$$

$$m_0^1(t)=\{\cos(t)-\cos(2t)\}/4$$

Therefore, m00 (0) and m01(0) are derived.

$$m_0^0(0)=1$$

$$m_0^1(0)=0$$

And also, m1(t) is introduced to the filter bank.

$$m_1(t)=\{-1+\cos(t)+\cos(2t)\}/2$$

Then m10(t) and m11(t) are obtained respectively.

$$m_1^0(t)=\{-1+\cos(t)\}/2$$

$$m_1^1(t)=\{\cos(t)+\cos(2t)\}/2$$

Therefore, m10(0) and m11(0) are derived.

$$m_1^0(0)=0$$

$$m_1^1(0)=1$$

This characteristic is called that the interpolation function has orthogonality for finite sum or discrete orthogonality.

The approximation error is defined as this.

$$e(t)=f(t)-g(t)$$

Then it becomes as this.

$$e(t)=u+v\{\cos(t)\}+w\{\cos(2t)\}$$

It is provided as this.

$$u=-v=w=\{a-b+2c\}/4$$

Now, the signal e(t) is introduced to the filter bank. Then e0(t) and e1(t) are obtained.

$$e_0(t)=u+v\{\cos(t)\}$$

$$e_1(t)=v\{\cos(t)\}+w\{\cos(2t)\}$$

Therefore, it holds that e0(0)=0 and e1(0)=0. That is, the sample value of the output signal corresponding to e(t) becomes zero.

And according to calculation, the values are obtained as this.

$$u=-v=w=\{a-b+2c\}/4$$

From that, it holds as this.

$$(a^2/2+b^2/2+c^2)-(u^2/2+v^2/2+w^2)=(1/8)\{(a+b)^2+2(a-c)^2+2(b+c)^2\}$$

Therefore, according to the assumption that the value of $(a^2/2+b^2/2+c^2)$ is not more than 1, the value of $(u^2/2+v^2/2+w^2)$ becomes also not more than 1. Therefore, The error signal e(t) also belongs to the signal set S. The set of the approximation error e(t) is defined as S0. From above, the set S includes the set S0.

By the way, the other arbitral approximation signal than f(t) using the sample values $$f_0(0)=a+b$$

$$f_1(0)=b+c$$

is defined as this.

$$y(t)=Y(f_0(0),f_1(0),t)$$

However, when $$f_0(0)=f_1(0)=0,$$

Then y(t) is always zero. The approximation error of this approximation formula is defined as this.

$$z(t)=f(t)-y(t)$$

As f0(0) and f1(0) are defined from f(t), z(t) also depends on f(t). This is expressed as $$z(t)=z\{f(t)\}$$

As a measure of comparison of approximation, upper-limit measures E (t) and E0(t) are adopted.

$$E(t)=\sup\beta[z(t);S]$$

$$E_0(t)=\sup\beta[e(t);S]$$

They are the upper-limit measures of the absolute values of z(t) and e(t) when f(t) is changed in the signal set S with fixed t. β is an arbitral positive operator or functional. And it is written as sup β[z(t); S₀] for example when the signal set to select f (t) is restricted to the set S0.

Especially, with regard to only the signal f(t)=e(t) in the set S0, as f0(0)=e0(0)=0 and f1(0)=e1(0)=0, then, y(t)=Y(f0 (0), f1(0), t)=Y(e0(0), e1(0), t)=Y(0, 0, t)=0, and it holds that z(t)=Z{e(t)}=e(t)-y(t)=e(t)-0=e(t). If the range of the set to select f(t) is reduced, naturally, the upper-limit of the error E(t) becomes small. More correctly, it becomes small or keeps equal. With regard to S and S0, it holds as follows.

$$E(t) = \sup\beta[z(t); S] \geq \sup\beta[z(t); S_0]$$

$$= \sup\beta[e(t) - y(t); S_0]$$

$$= \sup\beta[e(t); S_0]$$

Thus the lower-limit of E(t) is obtained.

Now, the signal f(t) is changed in the set S0 where f(t)=e(t). The upper-limit of β[e(t); S₀] with regard to e(t) is calculated. It is the same as this. That is, the upper-limit of β[e(t);S] with regard to the same error e(t) is calculated when the signal f(t) is changed in the set S where the error is e(t). Thus, E0(t), the measure of the error in the linear approximation using the interpolation of the example, is the lower-limit of all E(t) including nonlinear approximation. Moreover, it also makes the measure of the upper-limit error with regard to any β together at the same time. For example, β may be the square error or upper-limit of the absolute value of differentials or integrals.

Moreover, it is assumed that the linear processing X to remove the disturbance from the signal can be defined. For example, it is assumed that b {cos(t)} is the disturbance and the signal fs(t)=a+c {cos(2t)} is the target signal. With the analysis filter of the observation system in this example, the disturbance cannot be removed. However, it can be removed with the linear filter X whose transmission is 0 near the frequency of cos(t) and 1 at other frequency. While $$f_s(t) - X(g(t)) = X(f(t)) - X(g(t))$$

$$= X(f(t) - g(t))$$

$$= X(e(t))$$

then, assuming this X a kind of β, the approximation formula X(g(t)) to use the sample value including the disturbance is the optimum approximation formula of the target signal fs(t).

The optimum interpolation function can be obtained in the way that the error measure is calculated in the case of absolute error in the most simple form of β and the differential processing is performed on it. The detail explanation is omitted. This method can be extended to the multidimensional signal and multidimensional vector signal. For example, instead of f(t), also for the two-variable signal of f(x, y), the same optimum approximation can be constructed. Naturally, this approximation shows good approximation characteristics on the signal of separated variables such as f(x, y)=f(x)f(y).

Figure 10:
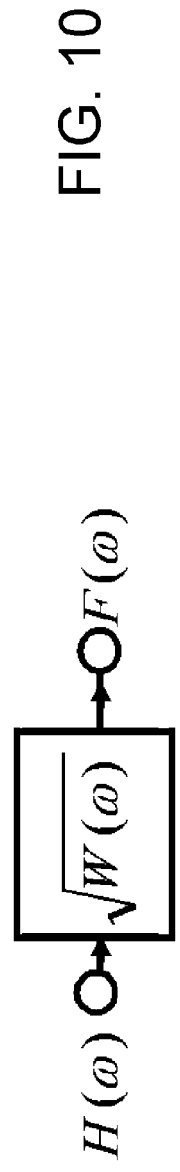
FIG. 10 There is shown an explanatory diagram of a spectrum $F(\omega)$ of a signal $f(x)$.
Figure 11:
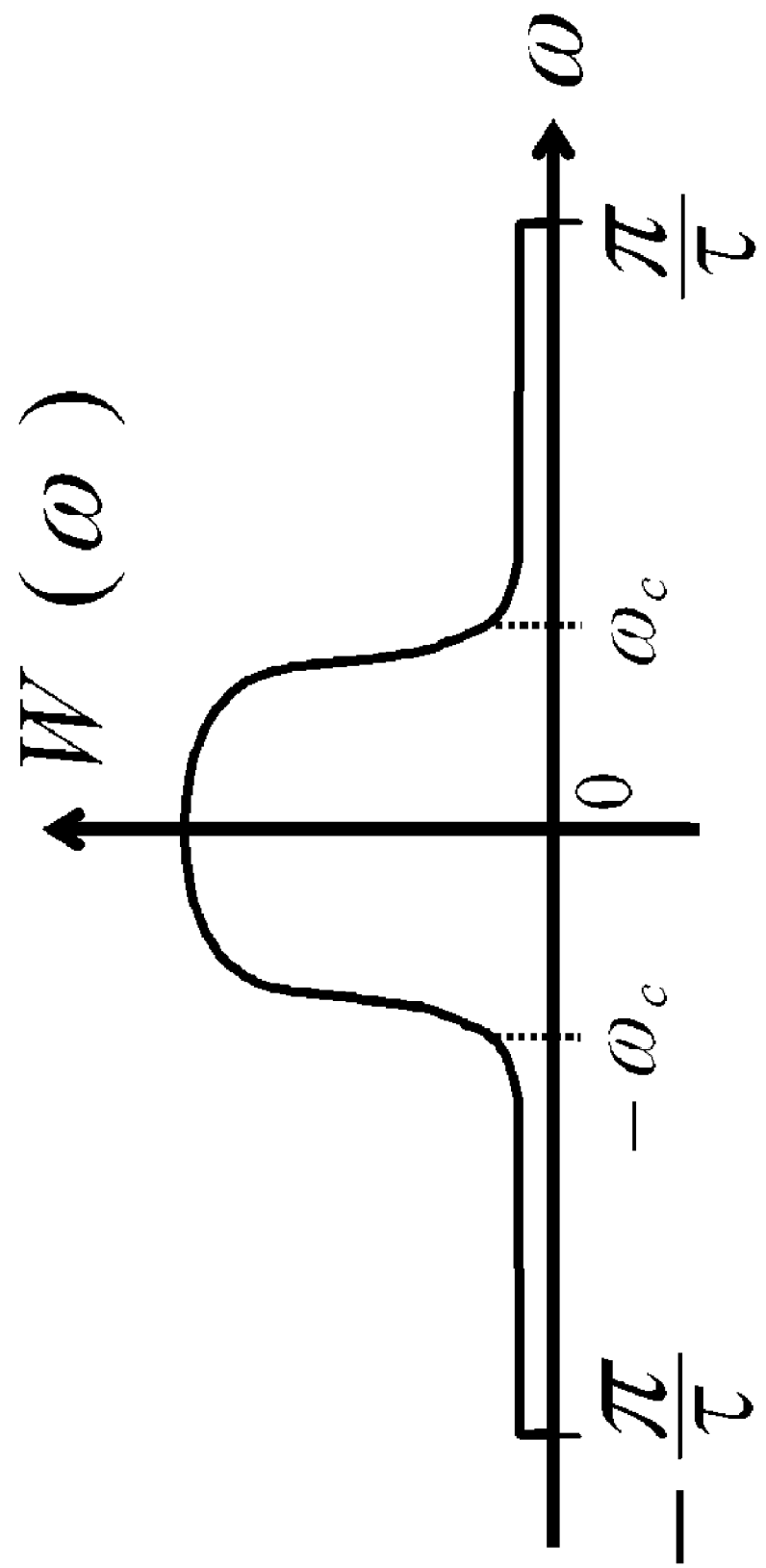
FIG. 11 There is shown a diagram to show an example of a weight function.
Figure 12:
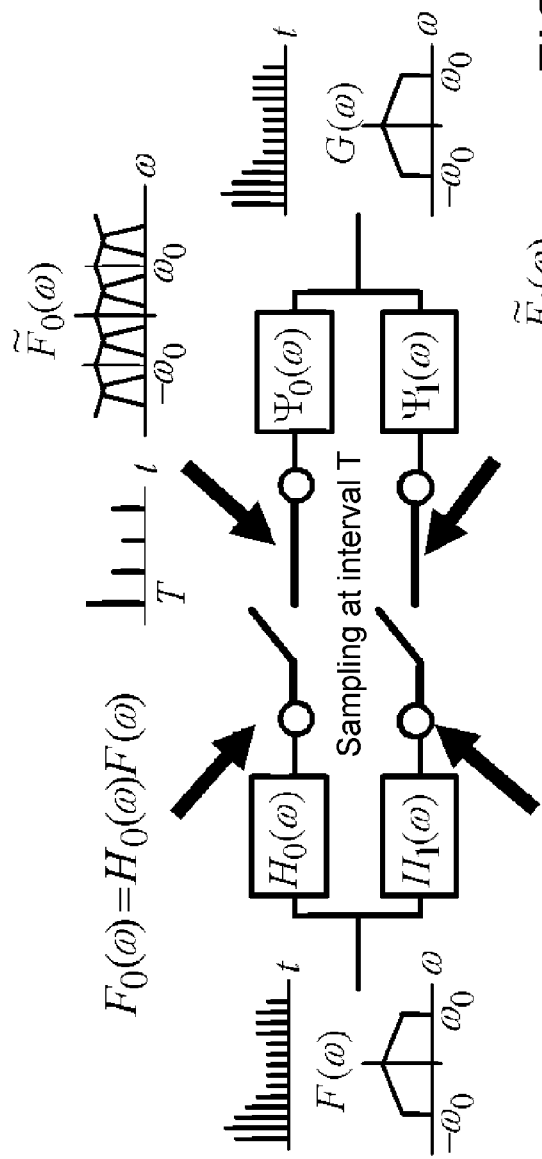
FIG. 12 There is shown an explanatory diagram of a filter bank with 2 paths.
Figure 13:
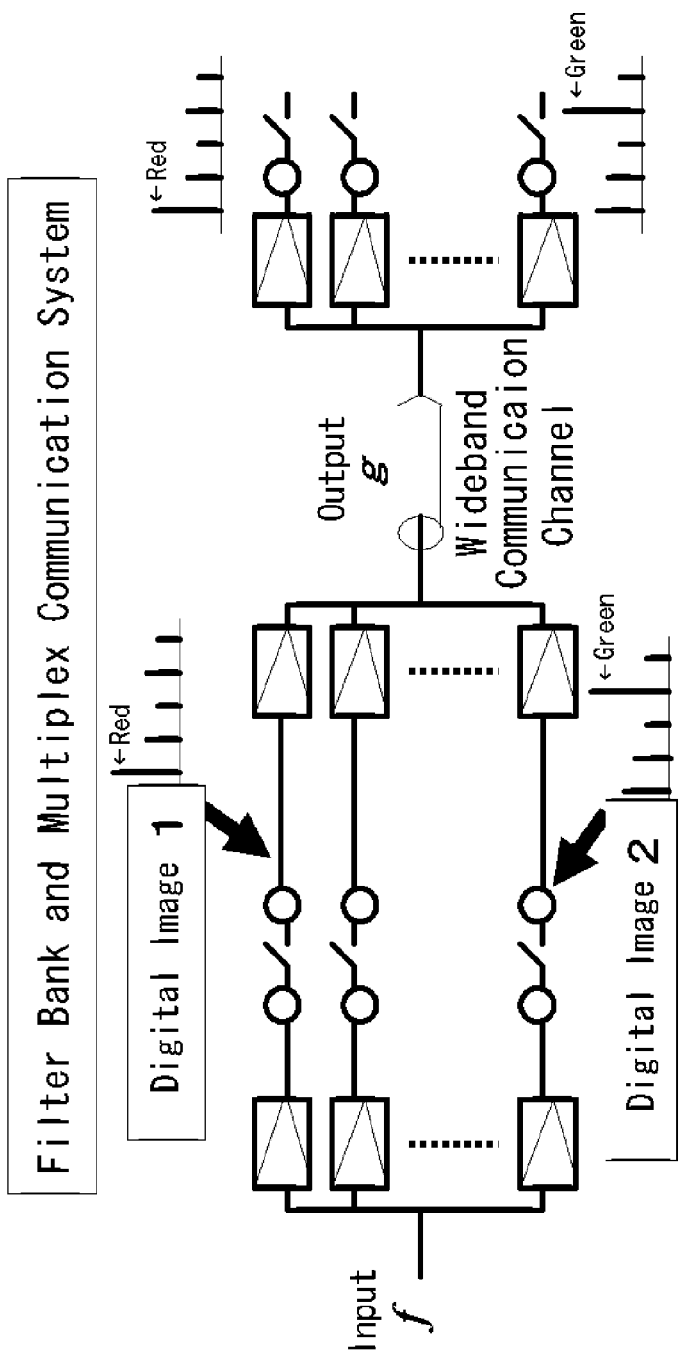
FIG. 13 There is shown an explanatory diagram of a digital multiplex communication system.

The subject mentioned above to find the practical signal set to fulfill two conditions and the optimum approximation formula under that condition is concerned again. As such example, the following signal set is presented. That is, as shown in FIG. 10, the Fourier spectrum of the source signal h(t) is assumed as H(ω). The energy of the source signal h(t) is assumed less than the given positive number A. In this case, the output signal out of the filter with the given positive transfer function √(W(ω)) when the source signal h(t) is entered is defined as f(t). Its Fourier spectrum is defined as F(ω). As shown in FIG. 10, F(ω) will fulfill the inequality shown in FIG. 10. The set of the signal f(t) with F(ω) to fulfill such restriction is defined as the signal set Ξ. In this case, the function W(ω) is named the weight function.

Now, the signal is extended to the signal with two variables in separated variable form. The source signal $h(x, y) = h_a(x)h_b(y)$ is assumed to pass the linear filter $H_a(u) H_b(v)$. It should be noted that the frequency variable u is the frequency variable corresponding to the variable x. The frequency variable v is the frequency variable corresponding to the variable y. The output signal out of the linear filter $H_a(u) H_b(v)$ is also the separated variable type. The signal is of the form as follows.

$$f(x,y) = f_a(x) f_b(y)$$

Then, next, the example of the case including nonlinear operation of second order is shown. Now, for example, in the above example, consider the signal as follows.

$$f(x,y) = f(x)[a\{m_0(y) + m_1(y)\} + bf(y)]$$

It should be noted that a and b are the given constants. The functions $m_0(y)$ and $m_1(y)$ are the functions constructed as the variable t in the interpolation functions $m_0(t)$ and $m_1(t)$ of the above example is changed to the variable y.

This signal is the signal in the separated variable form as $$f(x,y) = r(x)s(y)$$

Here, $r(x) = f(x)$ and $s(y) = a\{m_0(y) + m_1(y)\} + b\,f(y)$

Moreover, with respect to the interpolation function in above example, the signal $$m_0(t) = \{3 + \cos(t) - \cos(2t)\}/4$$

is introduced to the filter bank. Then, $$m_0^0(t) = \{3 + \cos(t)\}/4$$

$$m_0^1(t) = \{\cos(t) - \cos(2t)\}/4$$

are obtained.

$$m_0^0(0) = 1$$

$$m_0^1(0) = 0$$

are resulted. Also, $$m_1(t) = \{-1 + \cos(t) + \cos(2t)\}/2$$

is introduced to the filter bank. Then, $$m_1^0(t) = \{-1 + \cos(t)\}/2$$

$$m_1^1(t) = \{\cos(t) + \cos(2t)\}/2$$

are obtained.

$$m_1^0(0) = 0$$

$$m_1^1(0) = 1$$

are resulted. This characteristic is called that the interpolation function has orthogonality for finite sum or discrete orthogonality.

Now, consider the two-dimensional filter bank composed of two-dimensional filter as $$H_0(u,v) = H_0(u)H_0(v) + H_0(u)H_1(v) + H_1(u)H_1(v)$$

$$H_1(u,v) = H_0(u)H_0(v) + 2H_0(u)H_1(v) - 3H_1(u)H_1(v)$$

It should be noted that $H_0(u)$ and $H_1(u)$ are ideal low-pass filter and high-pass filter assumed in above example.

In this case, when the signal $$f(x, y) = f(x)[a\{m_0(y) + m_1(y)\} + bf(y)]$$
$$= r(x)s(y)$$

is introduced in such two-dimensional filter bank, the output signals are $$f_0(x,y) = r_0(x)s_0(y) + r_0(x)s_1(y) + r_1(x)s_1(y)$$

$$f_1(x,y) = r_0(x)s_0(y) + 2r_0(x)s_1(y) - 3r_1(x)s_1(y)$$

It should be noted that $r_0(x)$, $s_0(x)$, $r_1(x)$ and $s_1(x)$ are output signals when the signals r(x) and s(x) passed the filters $H_0(u)$ and $H_1(u)$ respectively. And this two-dimensional filter bank is merely an example. It may be the arbitrary linear sum of the filter of separated variable type. The form of function is to be known.

Therefore, especially, considering the discrete orthogonality of the interpolation functions $m_0(x)$ and $m_1(x)$, the sample values of $f_0(x, y)$ and $f_1(x, y)$ at the sample point of x=y=0 become to be the complicated sample values mixed with the sample value of the output signal when the signal f(x) passed the filters $H_0(u)$ and $H_1(u)$ as follows respectively.

$$f_0(0, 0) = r_0(0)s_0(0) + r_0(0)s_1(0) + r_1(0)s_1(0)$$
$$= f_0(0)[a + bf_0(0)] + f_0(0)[a + bf_1(0)] +$$
$$f_1(0)[a + bf_1(0)]$$

$$f_1(0, 0) = r_0(0)s_0(0) + 2r_0(0)s_1(0) - 3r_1(0)s_1(0)$$
$$= f_0(0)[a + bf_0(0)] + 2f_0(0)[a + bf_1(0)] -$$
$$3f_1(0)[a + bf_1(0)]$$

As this example is simple, only the sample point of x=y=0 is considered. Of course, as mentioned above, this theory is extended to the more complicated cases. In that case, as the number of the filters and sample points are many, the sample value at that case becomes to be the nonlinearly transformed sample value as complicatedly mixed with the sample values of the output of the filters at the generally different sample points when the signal f(x) passed the generally different filters.

However, it is considered that the optimum approximation is applied to the two-dimensional case using the sample value of the output signal when the separated-variable type signal f(x, y)=r(x)s(y) is entered in the mere two-variable filter bank. Then, the approximation formula of f(x, y)=r (x) s (y) can be calculated using the sample values $f_0(0, 0)$ and $f_1(0, 0)$. Then, that approximation formula is defined as g(x, y).

Now, in the case of the signal of f(x, y) and the approximation formula g(x, y), the variable y is changed to x. Then, the one-dimensional signal is obtained as follows.

$$\alpha(x) = f(x, x)$$
$$= f(x)[a\{m_0(x) + m_1(x)\} + bf(x)]$$
$$= f(x)[a\{\{1 + 3\cos(x) + \cos(2x)\}/4\} + bf(x)]$$

$$z(x) = g(x, x)$$

This approximation shows the optimum approximation performance in the sense as explained above. Therefore, the function $g(x, x)$ is the good approximation of $\alpha(x)=f(x, x)$. Moreover, for example, at the discrete divided points as $x=\pi/2+2$ n $\pi$, it holds that $\alpha(\pi/2+2$ n $\pi)=b$ f $(\pi/2+2$ n $\pi)^2$. Therefore, naturally, $\{g(x, x)/b\}^{1/2}$ is the solution to the very complicated problem that the value of f(x) is approximated at the discrete equally-divided points ($\pi/2+2$ n $\pi$) using the nonlinearly-transformed sample values in the complicatedly-mixed form of sample values of the output signal at the generally-different sample points when the signal f(x) passed the generally-different filters.

Referring to FIG. 3, the specific approximation method is explained. The signal f(x) is the unknown signal to be approximated. The equivalent circuit of the analysis filter is composed of LPF, HPF, multipliers and adders. The signal to be observed through the analysis filter is as follows.

$$F_0(t)=f_0(t)^2+f_0(t)f_1(t)+f_1(t)^2$$

$$F_1(t)=f_0(t)^2+2f_0(t)f_1(t)-3f_1(t)^2$$

The signal $f_0(t)$ is the output signal of f(t) through LPF. The signal $f_1(t)$ is the output signal of f(t) through HPF. The linear filter as LPF or HPF is called as unit filter. The analysis filter to yield the quadratic expression of the output signal of the input signal through the unit filter is called the filter with quadratic polynomial characteristics or quadratic characteristic filter. As the approximation cannot be calculated directly from the quadratic polynomials, the approximation function is calculated using the transformed formula to two-dimensional formula.

As shown in FIG. 4, The unknown signal f(x) f(y) in xy-space is entered in the linear analysis filter. Consider that the two-dimensional output signal as follows is obtained.

$$f_0(x)f_0(y)+f_0(x)f_1(y)+f_1(x)f_1(y)$$

$$f_0(x)f_0(y)+2f_0(x)f_1(y)-3f_1(x)f_1(y)$$

As this system is linear, the approximation formula of f(x) f(y) can be calculated. The sample value of the output signal at t=0 is the same as that of the output signal at x=y=0. Then, The approximation formula of f(x) f(y) can be expressed with the linearly-combined approximation function of the interpolation functions with the sample values of the output signal at t=0.

When the approximation formula of f(x) f(y) is defined as g(x, y), it can be expressed as follows.

$$g(x,y)=F_0(0)g_0(x,y)+F_1(0)g_1(x,y)$$

The function $g_0(x, y)$ is the interpolation function that the sample value of the output signal of the first filter at x=y=0 becomes 1 and the sample value of the output signal of the second filter becomes 0. The function $g_1(x, y)$ is the interpolation function that the sample value of the output signal of the first filter at x=y=0 becomes 0 and the sample value of the output signal of the second filter becomes 1.

The interpolation function can be calculated as follows for example. The interpolation functions $m_0(t)$ and $m_1(t)$ corresponding to LPF and HPF are combined. The function of linear combination of $m_0(x)m_0(y)$, $m_0(x)m_1(y)$, $m_1(x)m_0(y)$ and $m_1(x)m_1(y)$ are entered to the first filter and the second filter. The coefficients are calculated according to the condition of output signal. Then the interpolation functions are derived as follows.

$$g_0(x,y)=(3/5)m_0(x)m_1(y)+(2/5)m_1(x)m_1(y)$$

$$g_1(x,y)=(1/5)m_0(x)m_1(y)-(1/5)m_1(x)m_1(y)$$

As the function g(x, y) is the approximation formula of f(x) f(y), the function g(x, x) becomes the approximation formula of f(x) f(x)=f(x)$^2$. Therefore, the function $\sqrt{g(x, x)}$ becomes the approximation formula of f(x). The sign of the function $\sqrt{g(x, x)}$ can be determined with the measurement of the sign of f(0) for example.

Though the characteristic of the analysis filter is more than or equal to cubic, in the same way, the approximation formula can be found assuming the multi-dimensional linear filter more than or equal to cubic. For example, the cubic expression is as follows.

$$F_0(t)=f_0(t)^3+f_0(t)^2f_1(t)+f_1(t)^3+\ldots$$

$$F_1(t)=f_0(t)^3+2f_0(t)f_1(t)^2-3f_1(t)^3+\ldots$$

The output signal of the cubic filter becomes as follows.

$$f_0(x)f_0(y)f_0(z) + f_0(x)f_0(y)f_1(z) + f_1(x)f_1(y)f_1(z) + \ldots$$

$$f_0(x)f_0(y)f_0(z) + 2f_0(x)f_1(y)f_1(z) - 3f_1(x)f_1(y)f_1(z) + \ldots$$

Naturally, it may contain the terms less than or equal to quadratic. Depending on the transfer functions of each unit filter and these functions, the interpolation functions can be obtained at sampling timings. The linear combination of the interpolation functions is calculated with the coefficients of sample values at the sampling timings. It becomes the approximation formula in the form of cubic of the source signal. The cubic root of this approximation formula is the approximation formula of the source signal. The approximation formulas at the sampling timings of equal intervals are composed with the standard interpolation function. In this way, even though it is the nonlinear signal expressed with polynomials, the optimum approximation formula can be obtained.

More detailed explanation is given. Now, it is assumed that the discrete sample points $x_0, x_1, \ldots, x_p$ are defined on x-axis. Moreover, the signal is defined by inverse Fourier transform as follows.

$$f(x)=(1/2\pi)\int_{-\pi}^{\pi}F(u)\exp(jxu)du$$

In this case, the Fourier transform F(u) of f(x) fulfills the following $$\int_{-\pi}^{\pi}|(F(u)/W(u))|^2 \leq A$$

The set of f(x) to fulfill such condition is defined as $\Xi$.

By the way, with respect to the function f(x) belonging to $\Xi$ and the sample points $x_0, x_1, \ldots, x_0$, for example, it is assumed that the sample values corresponding to the cubic nonlinear function value with respect to f(x) are given as follows.

$$f_0(x_p) = \sum_{k=0}^{L}\sum_{m=0}^{L}\sum_{n=0}^{L}\alpha_{k,m,n}f(x_p-k)f(x_p-m)f(x_p-n) +$$

-continued $$\sum_{k=0}^{L}\sum_{m=0}^{L}\beta_{k,m}f(x_p-k)f(x_p-m)+$$

$$\sum_{k=0}^{L}\lambda_k f(x_p-k)+\sigma \quad (p=0, 1, 2, \ldots, P)$$

Consider the problem to calculate approximately the function f(x) depending upon these (P+1) sample values $f_0(x_p)$, (p=0, 1, 2, ..., P), corresponding to the cubic nonlinear function values with respect to f(x). Clearly, in order to calculate approximately the function f(x) depending upon these (P+1) sample values $f_0(x_p)$, (p=0, 1, 2, ..., P), corresponding to the cubic nonlinear function values with respect to f(x), it is needed to solve the nonlinear simultaneous equations obtained by (P+1) simultaneous equations of cubic nonlinear characteristics. The solution is very difficult.

Then, consider the following three-variable function.

$$f_0(x, y, z) = \sum_{k=0}^{L}\sum_{m=0}^{L}\sum_{n=0}^{L}\alpha_{k,m,n}f(x-k)f(y-m)f(z-n)+$$

$$\sum_{k=0}^{L}\sum_{m=0}^{L}\beta_{k,m}f(x-k)f(y-m)+\sum_{k=0}^{L}\lambda_k f(x-k)+\sigma \quad (p=0, 1, 2, \ldots, P)$$

The three-variable Fourier transform of this function can be expressed as follows.

$$F_0(u, v, w) = \left[\sum_{k=0}^{L}\sum_{m=0}^{L}\sum_{n=0}^{L}\alpha_{k,m,n}\exp(-jku)\exp(-jmv)\exp(-jnw)\right] \times$$

$$F(u)F(v)F(w)+$$

$$\left[\sum_{k=0}^{L}\sum_{m=0}^{L}\beta_{k,m}\exp(-jku)\exp(-jmv)\right]F(u)F(v)+$$

$$\left[\sum_{k=0}^{L}\lambda_k\exp(-jku)\right]F(u)+\sigma$$

$$= H(u, v, w)F(u)F(v)F(w) + H(u, v)F(u)F(v)+$$

$$H(u)F(u)+\sigma$$

$$= [H(u, v, w), H(u, v), H(u), \sigma] \times$$

$$[F(u)F(v)F(w), F(u)F(v), F(u), 1]^t$$

$$= H^{\wedge}(u, v, w)F^{\rightarrow}(u, v, w)$$

Here, $H^{\wedge}(u, v, w)$ and $F^{\rightarrow}(u, v, w)$ are row vector and column vector, respectively, as defined as follows.

$$H^{\wedge}(u,v,w) = [H(u,v,w), H(u,v), H(u), \sigma]$$

$$F^{\rightarrow}(u,v,w) = [F(u)F(v)F(w), F(u)F(v), F(u), 1]^t$$

$[\ ]^t$ means transposed matrix.

The vector $F^{\rightarrow}(u, v, w)$ as defined above is called the spectrum vector of input signal. The following induced vector from the spectrum vector of input signal by inverse Fourier transform is input signal vector.

$$f^{\rightarrow}(x, y, z) = (1/2\pi)\int_{-\pi}^{\pi}\int_{-\pi}^{\pi}\int_{-\pi}^{\pi}F^{\rightarrow}(u, v, w) \times$$

$$\exp(j(xu + yv + zw))dudvdw$$

$$= [f(x)f(y)f(z), f(x)f(y), f(x), 1]^t$$

Clearly, when $\zeta$ is the small real number and the vector $\zeta^{\rightarrow}=[\zeta,\zeta,1,\zeta]$ is defined, it holds as follows.

$$f(x) \approx f(x, y, z)$$

$$= \zeta^{\rightarrow}f^{\rightarrow}(x, y, z)$$

$$= [\zeta, \zeta, 1, \zeta][f(x)f(y)f(z), f(x)f(y), f(x), 1]^t$$

Moreover, the vector $F^{\sim\rightarrow}(u, v, w)$ is defined as follows.

$$F^{\sim\rightarrow}(u,v,w) = [F^{\sim}(u)F^{\sim}(v)F^{\sim}(w), F^{\sim}(u)F^{\sim}(v), F^{\sim}(u), 1]$$

And also, the matrix W(u, v, w) is defined as follows.

$$W(u, v, w) = \begin{bmatrix} \frac{1}{W(u)W(v)W(w)}, & 0, & 0, & 0 \\ 0, & \frac{1}{2\pi}\frac{3}{W(u)W(v)}, & 0, & 0 \\ 0, & 0, & \frac{1}{(2\pi)^2}\frac{3}{W(u)}, & 0 \\ 0, & 0, & 0, & \frac{1}{(2\pi)^3} \end{bmatrix}$$

It is assumed that the following restrictive condition is imposed on the spectrum vector $F^{\rightarrow}(u, v, w)$ of the input signal using these vectors and matrix. This restrictive condition is expressed specifically as follows.

$$\int_{-\pi}^{\pi}\int_{-\pi}^{\pi}\int_{-\pi}^{\pi}|(F(u)F(v)F(w))/(W(u)W(v)W(w))|^2 dudvdw +$$

$$(3/(2\pi))\int_{-\pi}^{\pi}\int_{-\pi}^{\pi}\int_{-\pi}^{\pi}|(F(u)F(v))/(W(u)W(v))|^2 dudvdw +$$

$$(3/(2\pi)^2)\int_{-\pi}^{\pi}\int_{-\pi}^{\pi}\int_{-\pi}^{\pi}|F(u)/W(u)|^2 dudvdw +$$

$$(1/(2\pi)^3)\int_{-\pi}^{\pi}\int_{-\pi}^{\pi}\int_{-\pi}^{\pi}dudvdw \leq (A+1)^3$$

The following inequality is deduced directly from the above formula.

$$\int_{-\pi}^{\pi}\int_{-\pi}^{\pi}\int_{-\pi}^{\pi}|(F(u)F(v)F(w))/(W(u)W(v)W(w))|^2 dudvdw +$$

$$3\int_{-\pi}^{\pi}\int_{-\pi}^{\pi}|(F(u)F(v))/(W(u)W(v))|^2 dudv +$$

$$3\int_{-\pi}^{\pi}|F(u)/W(u)|^2 du + 1 \leq (A+1)^3$$

Therefore, it holds as follows.

$$\left[\int_{-\pi}^{\pi}|F(u)/W(u)|^2 du\right]^3 + 3\left[\int_{-\pi}^{\pi}|F(u)/W(u)|^2 du\right]^2 +$$

-continued $$3\int_{-\pi}^{\pi}|F(u)/W(u)|^2 du + 1 = \left[\int_{-\pi}^{\pi}|F(u)/W(u)|^2 du + 1\right]^3 \leq (A+1)^3$$

Consequently, the following is derived.

$$\int_{-\pi}^{\pi}|F(u)/W(u)|^2 du \leq A$$

The above restrictive condition is actually the restrictive condition with respect to F(u).

On the other hand, $f_0(x_p, x_p, x_p) = f(x_p)$.

Therefore, it holds as follows.

$$f(x_p) = (1/2\pi)\int_{-\pi}^{\pi}\int_{-\pi}^{\pi}\int_{-\pi}^{\pi} H^{\rightarrow}(u,v,w)F^{\rightarrow}(u,v,w)\times\exp(jx_p(u+v+w))dudvdw$$

Assume that, under the above formulation, the optimum approximation formula with respect to the multidimensional vector signal as shown in the nonpatent document 15 is applied to the input vector $f^{\rightarrow}(x, y, z)$, and the optimum approximation formula g(x, y, z) of the signal $f(x, y, z) = \zeta^{\rightarrow} f^{\rightarrow}(x, y, z) \approx f(x)$ is obtained. In this case, according to the optimum of approximation explained above, if $\zeta$ is small, g(x, x, x) gives good approximation of f(x).

As shown in the nonpatent document 15, the calculation to derive the optimum approximation formula g(x, x, x) needs only to solve the linear simultaneous equation, it need not nonlinear operation. Here an example is shown. This method has enough generality. When the sample value is expressed as follows, it can be extended.

$$f_i(x_p) = \sum_{k=0}^{L}\sum_{m=0}^{L}\sum_{n=0}^{L} \alpha_{k,m,n}^i f(x_p - k)f(x_p - m)f(x_p - n) +$$

$$\sum_{k=0}^{L}\sum_{m=0}^{L} \beta_{k,m}^i f(x_p - k)f(x_p - m) + \sum_{k=0}^{L} \lambda_k^i f(x_p - k) +$$

$$\sigma^i \quad (i = 0, 1, 2, \ldots, I; p = 0, 1, 2, \ldots, P)$$

That is, $$F_i(u, v, w) = \left[\sum_{k=0}^{L}\sum_{m=0}^{L}\sum_{n=0}^{L} \alpha_{k,m,n}^i \exp(-jku)\exp(-jmv)\exp(-jnw)\right]\times$$

$$F(u)F(v)F(w) +$$

$$\left[\sum_{k=0}^{L}\sum_{m=0}^{L} \beta_{k,m}^i \exp(-jku)\exp(-jmv)\right]F(u)F(v) +$$

$$\left[\sum_{k=0}^{L} \lambda_k^i \exp(-jku)\right]F(u) + \sigma^i$$

$$= H_i(u, v, w)F(u)F(v)F(w) + H_i(u, v)F(u)F(v) +$$

$$H_i(u)F(u) + \sigma^i$$

$$= [H_i(u, v, w), H_i(u, v), H_i(u), \sigma^i] \times$$

$$[F(u)F(v)F(w), F(u)F(v), F(u), 1]^t$$

$$= H_i^{\wedge}(u, v, w)F^{\rightarrow}(u, v, w)$$

And also, it is defined as follows.

$$H_i^{\wedge}(u,v,w) = [H_i(u,v,w), H_i(u,v), H_i(u), \sigma^i]$$

The matrix $\Omega^{\wedge}(u, v, w)$ is defined as follows.

$$\hat{\Omega}(u, v, w) = \begin{bmatrix} H_0(u, v, w), H_0(u, v), H_0(u), \sigma^0 \\ H_1(u, v, w), H_1(u, v), H_1(u), \sigma^1 \\ \vdots \\ H_I(u, v, w), H_I(u, v), H_I(u), \sigma^I \end{bmatrix}$$

It is extended as follows.

$$\begin{bmatrix} F_0(u, v, w) \\ F_1(u, v, w) \\ \vdots \\ F_I(u, v, w) \end{bmatrix} = \begin{bmatrix} H_0(u, v, w), H_0(u, v), H_0(u), \sigma^0 \\ H_1(u, v, w), H_1(u, v), H_1(u), \sigma^1 \\ \vdots \\ H_I(u, v, w), H_I(u, v), H_I(u), \sigma^I \end{bmatrix} \begin{bmatrix} F(u)F(v)F(w) \\ F(u)F(v) \\ F(u) \\ 1 \end{bmatrix}$$

Therefore, the following equation holds.

$$[f_0(x_p), f_1(x_p), \ldots, f_I(x_p)]^t =$$

$$(1/2\pi)\int_{-\pi}^{\pi}\int_{-\pi}^{\pi}\int_{-\pi}^{\pi} \Omega^{\wedge}(u, v, w)F^{\rightarrow}(u, v, w) \times \exp(jx_p(u + v + w))dudvdw$$

The optimum approximation method disclosed in nonpatent document 15 can be applied in the same way.

Finally, there is shown an effective method to restore the signal f(x) approximately by way of solution of linear simultaneous equation using discrete sample values of polynomial of f(x) in general.

As shown in the above, even if analysis filter is nonlinear, the optimum approximation formula of source signal can be derived because the signal approximation system in the embodiment of this invention is constructed as follows. Source signal of bounded norm is entered to analysis filters of FIR filters to yield an output signal expressed by a polynomial of converted source signal through a unit filter. The output signal is sampled regularly to make a discrete signal. The discrete signal is used as coefficients of linear combination of the interpolation functions by synthesis filters of FIR filters. The approximation function of the source signal is calculated based upon the combined function.

Industrial Availability

The discrete signal approximation system of this invention is most suitable for the broadcast and communication system in which the efficient transmission and communication of voice and image signal with very few distortions is important. It is also able to apply many fields such as the medical electronics of computer tomography to restore the 3-dimensional signal with little errors from the observed signals, the remote sensing field using SAR radar or subterranean radar, or the protein configuration analysis with signal processing in bioinformatics. It can be applied to many discrete signal-processing systems with changed parameters to minimize the upper-limit error measure in wide range. It can contribute to develop and to improve many kind of systems as the radar, the sonar, the missile tracking system, the medical signal processing system, the DNA analyzer and so on.

REFERENCE SYMBOLS

1. Source signal
2. Analysis FIR filter

3. Sampling means
4. Interpolation function generating means
5. Interpolation function memory means
6. Approximation formula generating means
7. Radical calculating means
8. Synthesis means
9. Approximation function

The invention claimed is:

1. A signal approximation system comprising: non-linear analysis filters to convert the source signal, a sampling means to sample an output signal of said non-linear analysis filter to make a discrete signal at every sampling timing of constant interval, synthesis filters to generate a first approximate function by combining linearly an interpolation functions with said discrete signal, a means to obtain a second approximate function by calculating a radical of said first approximate function at the sampling timing, a means to calculate an approximate function of said source signal by composing said second approximate functions; wherein said source signal is equivalent to a reversed signal of the spectrum whose norm is less than a given value, said non-linear analysis filter is a filter to yield a signal as described by a polynomial of the transformed signal from the source signal by linear filters, said interpolation function is the function according to said polynomial, said synthesis filter is a filter to generate said first approximation function of approximation of said source signal or its powered function by way of linear combination of said interpolation function with a coefficient of said discrete signal at every sampling timing.

2. A signal approximation system comprising: non-linear analysis filters to convert the source signal, a sampling means to sample an output signal of said non-linear analysis filter to make a discrete signal at every sampling timing of constant interval, synthesis filters to generate a first approximate function by linear combination of the interpolation functions with said discrete signal, a means to obtain a second approximate function by calculating the radical of said first approximate function at the sampling timing, a means to calculate an approximate function of said source signal by composing said first and second approximate functions; wherein said source signal is equivalent to a multi-dimensional signal based upon a reversed signal of the spectrum whose norm is less than a given value, said non-linear analysis filter is a filter to yield a signal as described by a polynomial of the transformed signal from the source signal by linear filters, said synthesis filter is a filter to generate said first approximate function of approximation of said source signal or its powered function by way of linear combination of said interpolation function with a coefficient of said discrete signal at every sampling timing.

3. The signal approximation system described in claim 1, wherein said synthesis filter is constructed of a FIR filter.

4. A signal approximation method comprising: a first step to transform the source signal with non-linear synthesis filters, wherein said source signal is equivalent to a reversed signal of the spectrum whose norm is less than a given value, a second step to obtain a discrete signal by sampling an output signal of said non-linear synthesis filter at every sampling timing of constant interval, a third step to generate a first approximate function by combining linearly an interpolation functions with said discrete signal with synthesis filters, a fourth step to obtain a second approximate function by calculating a radical of said first approximate function at the sampling timing, a fifth step to calculate an approximate function of said source signal by composing said second approximate functions; wherein said non-linear analysis filter is a filter to yield a signal as described by a polynomial of the transformed signal from the source signal by linear filters, said interpolation function is a function according to said polynomial, said synthesis filter is a filter to generate said first approximate function of approximation of said source signal or its powered function by way of linear combination of said interpolation function with a coefficient of said discrete signal at every sampling timing.

5. A signal approximation method comprising: a first step to transform the source signal with non-linear synthesis filters, wherein said source signal is equivalent to a multi-dimensional signal based upon a reversed signal of the spectrum whose norm is less than a given value, a second step to obtain a discrete signal by sampling an output signal of said non-linear synthesis filter at every sampling timing of constant interval, a third step to generate a first approximate function by linear combination of an interpolation functions with said discrete signal with synthesis filters, a fourth step to obtain a second approximate function by calculating a radical of said first approximate function at the sampling timing, a fifth step to calculate an approximate function of said source signal by composing said first and second approximate functions; wherein said non-linear analysis filter is a filter to yield a signal as described by the polynomial of the transformed signal from the source signal by linear filters, said interpolation function is a function according to said polynomial, said synthesis filter is a filter to generate said first approximate function of approximation of said source signal or its powered function by way of linear combination of said interpolation function with the coefficient of said discrete signal at every sampling timing.

6. The signal approximation method described in claim 4, wherein said synthesis filter is constructed of a FIR filter.

7. The signal approximation method described in claim 5, wherein said synthesis filter is constructed of a FIR filter.

8. The signal approximation system described in claim 2, wherein said synthesis filter is constructed of a FIR filter.

* * * * *